United States Patent
Toumiya

(10) Patent No.: US 6,425,104 B1
(45) Date of Patent: Jul. 23, 2002

(54) METHOD AND SYSTEM FOR TEST PATTERN GENERATION AND A COMPUTER READABLE MEDIUM INSTRUCTING THE SYSTEM TO PERFORM THE METHOD

(75) Inventor: Tamaki Toumiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,938

(22) Filed: Dec. 28, 1999

(30) Foreign Application Priority Data

Dec. 28, 1998 (JP) ............................................. 10-371780

(51) Int. Cl.[7] .............................................. G01R 31/28

(52) U.S. Cl. ...................................................... 714/738

(58) Field of Search ................................ 714/738–739, 714/728

(56) References Cited

U.S. PATENT DOCUMENTS 6,059,451 A * 5/2000 Scott et al. .................. 714/726
6,205,567 B1 * 3/2001 Maruyama ................... 714/741
6,269,463 B1 * 7/2001 Duggirala et al. ........... 714/738

FOREIGN PATENT DOCUMENTS

JP 11-211801 8/1999
JP 11-237450 8/1999

* cited by examiner

*Primary Examiner*—Albert Decady
*Assistant Examiner*—Shelly A Chase
(74) *Attorney, Agent, or Firm*—Young & Thompson

(57) ABSTRACT

The present invention discloses a method and a system for test pattern generation which is capable of reducing the processing time for test pattern generation. A target circuit for test pattern generation is divided into a plurality of subcircuits. Pattern generation order of each subcircuits is determined for reducing the total test pattern generation time.

12 Claims, 16 Drawing Sheets

METHOD AND SYSTEM FOR TEST PATTERN GENERATION AND A COMPUTER READABLE MEDIUM INSTRUCTING THE SYSTEM TO PERFORM THE METHOD

BACKGROUND OF THE INVENTION

1. Field of the Invention

The present invention relates to a method and a system for generating a test pattern used for fault detection or the like of a large scale integrated circuit (LSI) as well as a computer readable medium instructing the system to perform the method. More particularly, the invention relates to a method and a system suitable for the case where the entirety of an objective circuit for test pattern generation is divided into a plurality of subcircuits and a test pattern generating method and a system suited for generating test patterns for these subcircuits by means of distributed processing, as well as a computer readable medium instructing the system to perform the method.

2. Description of Related Art

Accompanying the increase in complexity and enlargement in scale of the integrated circuits such as LSIs, techniques are in fashion in which the entirety of an objective circuit for test pattern generation is divided into a plurality of subcircuits with a specified scale, and the test pattern generation for each subcircuit is processed distributedly by means of a plurality of computers. The inventor of the present invention and others disclosed such a method as Japanese Laid Open Patent Publication No. 11-211801 and No. 11-237450, which were laid open after the priority date of the present invention. Their invention has been filed in US patent application as Ser. No. 09/236,903. FIG. 11 shows a schematic configuration of such a test pattern generation system employing a circuit division distributed processing technique. As shown, in this test pattern generation system a plurality of engineering work stations (EWSs) are interconnected via a network NW such as a local area network (LAN). Note, however, that beside the mode shown in the figure, various kinds of other mode, such as one in which a plurality of central processing units (CPUs) are connected by busses to a single computer with multiprocessor configuration, are also conceivable.

In the figure, each of EWSs 1-1 to 1—n (n is a natural number) is a computer in charge of automatic generation processing of a test pattern, and performs at one point in time, test pattern generation for one subcircuit. In what follows, the CPU mounted on each EWS will be referred to as "remote CPU". In general, the total number of subcircuits obtainable by circuit division is set to be a number far greater than the number n of the remote CPUs. On the other hand, EWS 1-0 is a computer which integrally controls the EWSs 1-1 to 1-n, and after division of the entirety of the object of test pattern generation into subcircuits, performs distributed processing of test pattern generation for the entire circuit by letting EWSs 1-1 to 1-n execute test pattern generation processing for respective subcircuits. In the following, the CPU mounted on the EWS 1-0 will be referred to as "local CPU".

The local CPU hands over information ("subcircuit information" in the figure showing the constitution of the subcircuits and a collection of fault information ("fault list" in the figure) to be detected for respective subcircuits to each remote CPU, and requests them to generate test patterns for the subcircuits. The fault information includes fault position information for the entire circuit, identification information showing whether the fault is a "1" fault or a "0" fault, and the like. In the meantime, a remote CPU requested the processing by the local CPU generates a test pattern based on the received subcircuit information and fault list and sends the result back to the local CPU. In addition, it determines information on the faults which were undetectable by the generated test pattern and reports it back to the local CPU. Here, the local CPU is constantly watching the processing conditions to see whether respective remote CPUs are in the process of executing test pattern generation. Whenever the result of test pattern generation (pattern and undetected fault information) is reported back from some remote CPU, the local CPU retrieves remote CPUs in idle state which are not executing the test pattern generation processing, selects a subcircuit which has not yet completed the processing, and requests an idle remote CPU to generate a test pattern for that subcircuit.

Now, the size (here, the number of gates) of the subcircuit obtained by the circuit subdivision is calculated in advance to be a prescribed value based on the evaluation in consideration of obtaining the optimum processing efficiency of test pattern generation. Accordingly, the local CPU performs circuit subdivision so as to have the size of the subcircuit to be approximately equal to the prescribed value. In this case, a subcircuit is constructed by collecting a plurality of circuit blocks called "cones" which will be described later. In FIG. 12 which illustrates a circuit diagram for only a part extracted from the entire circuit which is the object of test pattern generation, symbols Ti1 to Ti7 are input terminals, symbols To1 and To2 are output terminals, and symbols 5-1 to 5-6 are logic gates. In addition, symbols 6-1 and 6-2 are circuit block composed of the input terminals, output terminal, and logic gates, which will be called cones in this invention, so named in association with the shapes of the cross section of cones along the axes. Moreover, since these input terminals and the output terminal act as the interfaces between the circuit as a whole and the outside, these are sometimes called external input terminals and an external output terminal.

The cones are in 1 to 1 correspondence with the output terminals, and a cone is defined as a set of all the logic gates passed through and all the input terminals arrived at, and the output terminal being the starting point, before one arrives at input terminals when one traces logic gates sequentially starting from an output terminal toward the input terminals. In other words, a cone is formed by the collection of all the logic gates and input terminals through which a logical value can be propagated to a certain output terminal, together with that output terminal. For example, when the paths within the circuit are traced with the output terminal To1 as a starting point, since the output terminal To1 is connected to the logic gate 5-1, the logic gate is included in the cone 6-1. Further, the logic gate 5-1 is connected to the input terminals Ti1 and Ti2 and the logic gate 5-2. Since, however, the logic gate 5-2 is not connected in the direction from the output terminal To1 to the input terminal, it is excluded and only the input terminals Ti1 and Ti2 are included in the cone 6-1. That is, the cone 6-1 is composed of the output terminal To1, the logic gate 5-1, and the input terminals Ti1 and Ti2. The cone 6-2 is formed by the same procedure, and it includes output terminal To2, the logic gates 5-2 to 5-6, and the input terminals Ti2 to Ti7. As is clear from the above description, the entirety of the circuit which is the object of the test pattern generation includes cones equal to the number of its output terminals.

Although not shown in FIG. 12, in a scannable object circuit for test pattern generation, scannable flip-flops (abbreviated as FFs hereinafter) included in the circuit are handled as objects completely equivalent to the input or output terminals. In other words, those components to which logical values can be set or referred to from the outside of the circuit are handleable as being completely equivalent to the input or output terminals. Accordingly, if a scanning FF is arrived at when tracing a circuit in the direction from an output terminal toward the input terminal, the scanning FF can be regarded as equivalent to an input terminal as well as an output terminal, so that a new cone can be defined with the scanning FF as a starting point. Incidentally, in order to avoid complication, only circuits which do not include scanning FFs will be described in the following unless otherwise noted, but the discussion is applicable completely analogously to the circuits including scanning FFs that are equivalent to the input and output terminals.

FIG. 13 is a block diagram showing the important parts of the configuration of a test pattern generating system as a Related Art, which is not Prior Art. In the figure, a local CPU 1L corresponds to the CPU on the EWS 1-0 in FIG. 11, and a remote CPU 1R corresponds to a CPU mounted on either one of the EWSs 1-1 to 1—n in FIG. 11. A circuit information storage part 11 stores circuit information describing the kind of the input terminals, output terminal, and logic gates and the connection relationship among them. An external output terminal list preparing part 12 extracts all the output terminals from the circuit information stored in the circuit information storage part 11, and stores data of these output terminals in an external output terminal list storage part 13. In a circuit made scannable, the external output terminal list preparing part 12 extracts also the scanning FFs in addition to the output terminals. A subcircuit generating part 14 constructs subcircuits from the cones included in the entire circuit based on the storage contents of the circuit information storage part 11 and the storage contents of the external output terminal list storage part 13, and stores the result in a subcircuit storage part 15.

Moreover, a fault information storage part 16 stores all fault information to be detected for the entire circuit. A pattern ungenerated fault list control part 17 updates the storage contents of fault information for which test patterns are not yet generated so as for the contents to be held in a pattern ungenerated fault list storage part 18, based on the storage contents of the fault information storage part 16 and the storage contents of a pattern generated fault information storage part 27 (to be described later). When a test pattern generation of a subcircuit is requested to a certain remote CPU, a subcircuit fault list preparing part 19 prepares a list of faults included in the subcircuit based on the storage contents of the subcircuit storage part 15 related to the subcircuit and the storage contents of the pattern ungenerated fault list storage part 18, and stores the result in a subcircuit fault list storage part 20. A remote CPU assignment control part 24 manages the execution conditions of each remote CPU 1R, and selects an idle remote CPU 1R and requests that remote CPU 1R to generate a test pattern by handing over the circuit information and the fault list related to the generated subcircuit. In addition, the remote CPU assignment control part 24 communicates with various parts of the local CPU 1L via signal lines, not shown in the figure, and realizes such a processing as completion decision of the test pattern generation or the like.

In the meantime, in the remote CPU 1R, an automatic test pattern generating part 25 generates test patterns corresponding to respective fault information contained in the fault list based on the subcircuit information (the subcircuit storage part 15) and the fault list (the subcircuit fault list storage part 20) handed over from the local CPU 1L. As a result, the automatic test pattern generating part 25 stores the generated test patterns in a test pattern storage part 26, and stores pieces of fault information in the received fault list that are no longer required to be processed in the pattern generated fault information storage part 27 as pattern generated fault information. Here, the pattern generated fault information includes, besides pieces of fault information for which test patterns were actually generated, fault information for which the processing was dropped because of difficulty in generating test patterns, fault information which became clear that generation of test patterns is impossible in either one of the cones due to redundancy of the circuits, and the like. As to fault information for which test patterns were not generated under these circumstances, information indicating the reasons why test patterns were not generated are additionally stored in the pattern generated fault information storage part 27.

A pattern merge part 21 provided in the local CPU 1L combines test patterns generated in every remote CPU 1R and test patterns stored in a test pattern output part 28, and stores sequentially the generated test patterns in the test pattern output part 28. Besides, the pattern ungenerated fault list control part 17 outputs fault information for which test patterns were not generated to a pattern ungenerated fault list output part 29 at the point in time when the test pattern generation processing was conducted for all subcircuits contained in the entire circuit. In that case, the pattern ungenerated fault list control part 17 stores the reasons why test patterns were not generated in addition to a pattern ungenerated fault list. The reasons why test patterns were not generated includes such a situation that test pattern generation for unprocessed fault information is no longer needed because an expected fault detection rate has been attained, that the test pattern generation was given up because of an enormous amount of processing time required, that the test pattern generation was impossible because of the redundancy of the circuit, or the like.

In FIG. 14 which shows a more detailed constitution of the subcircuit generating part 14 shown in FIG. 13, constituent elements the same as those in FIG. 13 are given identical symbols. In the figure, a cone extracting part 31 randomly selects one output terminal which is not yet taken out of output terminals stored in the external output terminal list storage part 13, in order to add a cone to the subcircuits. The cone extracting part 31 finds a cone corresponding to the selected output terminal based on the storage contents of the circuit information storage part 11, and stores the circuit information on the cone to a cone storage part 32. In the meantime, the gate number and the circuit information of a subcircuit being on the process of generation are stored in the subcircuit storage part 15.

A subcircuit gate number counting part 33 adds the cone extracted on the cone storage part 32 to the subcircuits on the subcircuit storage part 15. In other words, the subcircuit gate number counting part 33 takes out the circuit information on the cone from the cone storage part 32 to calculate its gate number, and adds it to the gate number of the subcircuit on the subcircuit storage part 15 to updates the total gate number of the subcircuits being on the way to generation. In that case, the subcircuit gate number counting part 33 will not count the gate numbers of logic gates overlapping between cones into the total gate number of the subcircuit. Moreover, the subcircuit gate number counting part 33 adds the circuit information of the cone taken out to the circuit information of the subcircuits on the subcircuit storage part 15. Furthermore, the subcircuit gate number counting part 33 examines whether the total gate number of the updated subcircuits reached the prescribed value, and stops the cone selection operation by giving an indication to the cone extracting part 31 at the point in time when that condition is fulfilled. In this way, the subcircuit information to be given to the remote CPU 1R is generated on the subcircuit storage part 15. The subcircuit gate number counting part 33 initializes the total gate number of the subcircuit on the subcircuit storage part 15 to "0", and initializes the circuit information to the empty state whenever generation of a subcircuit is started anew.

FIG. 15 is a flow chart showing the procedure of test pattern generation executed in the test pattern generating system having the above constitution. First, circuit information and fault information for an objective circuit of test pattern generation are stored in the circuit information storage part 11 and the fault information storage part 16, respectively (step S1). Next, when test pattern generation is indicated to the local CPU 1L, the external output terminal list preparing part 12 prepares an external output terminal list by extracting all output terminals from the circuit information. The subcircuit generating part 14 selects randomly one output terminal which has not yet been selected from among generated external output terminals, and find the cone corresponding to the output terminal (step S2). Then, the subcircuit generating part 14 adds the selected cone to the subcircuits to be generated (step S3), and calculates the gate number of the subcircuit to decide whether the total gate number of the subcircuits on its way to generation reached the prescribed value (step S4). If the total gate number of the subcircuits is not reaching the prescribed value (the decision result is "No"), step S2 to step S4 are repeated until the prescribed value is reached (the decision result is "Yes"). In this way, cones are randomly selected one by one and subcircuit generated by the subcircuit generating part 14 is added up sequentially to obtain subcircuits with sufficiently large size. When the cones to be taken out from the objective circuit for test pattern generation are exhausted, the subcircuit generating part 14 decides the subcircuits at that point in time to be the final subcircuits even if the total gate number of the subcircuit being on its way to generation is not reaching the prescribed value.

In the meantime, the pattern ungenerated fault list control part 17 prepares a pattern ungenerated fault list for the entire circuit based on the given fault information, and stores it in the pattern ungenerated fault list storage part 18. Then, whenever the subcircuit generating part 14 generates a subcircuit, the subcircuit fault list preparing part 19 prepares a list of pattern ungenerated faults contained in the generated subcircuit, while referring to the storage contents of the pattern ungenerated fault list storage part 18, and stores the result in the subcircuit fault list storage part 20 (step S5). Next, the remote CPU assignment control part 24 selects either one of the generated subcircuits, reads the circuit information and the fault list related to the subcircuit from the subcircuit storage part 15 and the subcircuit fault list storage part 20, respectively, and retrieves a remote CPU 1R in idle state to hand the subcircuit information and the fault list over to the remote CPU 1R (step S6). In the remote CPU 1R, the automatic test pattern generating part 25 generates a test pattern for the selected subcircuit (step S7) and stores the result in the test pattern storage part 26, and stores the list of test pattern generated fault information in the pattern generated fault information storage part 27.

When either one remote CPU 1R which has been in the process of test pattern generation completes the processing, the remote CPU sends back the generated test pattern and the pattern generated fault information to the local CPU (step S8). Then, in the local CPU 1L, the pattern ungenerated fault list control part 17 deletes the pattern generated fault information sent back from the pattern ungenerated fault list for the entire circuit which has been stored in the pattern ungenerated fault list storage part 18. At this time, the pattern ungenerated fault list control part 17 calculates the fault detection rate for the entire circuit based on the updated pattern ungenerated fault list. In addition, the pattern merging part 21 adds the test pattern sent back to the test patterns stored (in this case there is none since this is the first time) in the test pattern output part 28 (step S9).

Next, the remote CPU assignment control part 24 decides whether the fault detection rate calculated by the pattern ungenerated fault list control part 17 reached the predetermined target value (95%, for example), and inquires the subcircuit generating part 14 whether there are still remaining unprocessed cones in the objective circuit for test pattern generation. If there still remains some unprocessed cones and the fault detection rate is not reaching the target value (the decision result in step S10 being "No"), the processes in step S2 to step S10 are repeated, and assigns a subcircuit to a remote CPU 1R in idle state. Thereafter, when the decision result of step S10 becomes "Yes" by either the fault detection rate attained the target value or the unprocessed cones are exhausted, the remote CPU assignment control part 24 designates the pattern ungenerated fault list control part 17 to transfer the pattern ungenerated fault list stored in the pattern ungenerated fault list storage part 18 to a pattern ungenerated fault list output part 29. As a result, it becomes possible to take out the test patterns and the pattern ungenerated fault list (step S11).

As in the above, according to the related test pattern generating system to the present invention, in the process of generating a subcircuit by bundling a plurality of cones, no consideration whatsoever is given to the order of selecting these cones, and the cones are selected utterly randomly from among the cones existing in the objective circuit for test pattern generation. Because of this, the following drawbacks arise in the related test pattern generating system, which are causing waste of the processing time. Namely, when a subcircuit is formed by collecting the cones, depending upon the constitution of the objective circuit for test pattern generation, there arise overlapped portions in which input terminals or gates are shared and overlapped between the cones (or between the subcircuits including the cones) as shown by region A in FIG. 12. In such a case, when a test pattern is generated first for either one of the cone 6-1 and 6-2, the fault information in which a test pattern is generated in the first test pattern generation process is excluded from the pattern ungenerated fault list for the entire circuit, and is put outside the processing objects in the test pattern generation process thereafter. For example, if the cone 6-2 is processed first, and test patterns are generated for all faults within the region A, then in the later test pattern generation of the cone 6-1, test pattern generation will be performed with the fault list from which the fault information included in the region A is removed, as the object.

The relationship between the scale of the cone (assumed to be the gate number here) and the processing time required for test pattern generation for the cone is known to be not a simple proportionality but is, for example, exponential. Because of this, if attention is focused on the processing time required for test pattern generation for the region A in FIG. 12, the time required in test pattern generation for the cone 6-2 is longer than that for the cone 6-1 in spite of test pattern generations for the identical region. That is, for a region of overlap between the cones, the total processing time is smaller when test pattern generation is performed first for the cone with smaller number of gates than in the case of performing test pattern generation for the cone with larger number of gates.

When a subcircuit is constructed by selecting cones in random order as is done in the related method, in the region where cones overlap, there will frequently occur cases in which test pattern generation is processed first for the cone having a larger number of gates. In other words, wasteful processing time is consumed by performing test pattern generation without giving priority to the cone having smaller number of gates. Such a drawback is not limited to the mode in which test pattern generation is charged to a plurality of CPUs as shown in FIG. 11, but it can happen also in a mode, for example, where test pattern generation is performed successively using a single CPU.

In addition, in the distributed processing of test pattern generation using a plurality of CPUs as shown in FIG. 11, the following problem will arise due to the fact that the related test pattern generating system does not pay attention to the overlap of the cones. Assume a case as shown in FIG. 16 that, while a certain remote CPU is performing test pattern generation for a subcircuit 7, a remote CPU other than the original remote CPU goes to the idle state and a subcircuit is assigned to this idle remote CPU. Assume further that only either one of cones 6-3 and 6-4 is added to a subcircuit to be newly generated. In that case, selection of the cone 6-3 which has a smaller region of overlap with the subcircuit 7 results in a smaller number of test patterns generated by the overlapping between the subcircuits to be newly generated and the subcircuit 7. Since, however, the related method takes no consideration on the overlap between the cones or the subcircuits, there is a possibility that a subcircuit including the cone 6-4 is assigned first and processed. Because of this, surplus test patterns are generated which produces a problem similar to that pointed out in the above, reducing the effect of distributed processing.

Furthermore, in the related test pattern generating system, the following drawbacks are generated due to the distributed processing of test pattern generation. Consider, for example, the case in which two EWSs are generating test patterns in parallel for subcircuits including respectively the cones 6-1 and 6-2 shown in FIG. 12. In this case, since no consideration is given to the overlap between the cones in the related test pattern generating system, concerning the fault information included in the region A, test patterns are generated in duplicate by the two EWSs almost at the same time. However, for a certain fault, it suffices to generate a test pattern only for either one subcircuit, and frequent occurrence of multiple generation of test patterns reduces the effect of distributed processing using a plurality of EWSs. In other words, not only a memory capacity for storing the test patterns and the processing time for generating the test patterns are required correspondingly, but also a longer test time is required in testing the circuit using the generated test patterns.

SUMMARY OF THE INVENTION

It is an object of the invention to provide a novel method of generating test patterns for a logic circuit, a novel system performing the method, and a novel computer readable medium instructing the system to perform the method.

It is an-other object of the present invention to provide a method and a system for test pattern generation which can reduce the processing time required for test pattern generation by considering the order of processing the subcircuits when the test patterns are generated using the technique of circuit division.

It is further object of this invention to provide a method and a system for test pattern generation which can reduce the processing time for test pattern generation by considering the overlap between a subcircuit already processed and a cone to be added to a subcircuit currently under generation when the test patterns are generated by using the technique of distributed processing along with the technique of circuit division.

It is further object of this invention to provide a method and a system for test pattern generation which can further reduce the processing time by eliminating the overlapping between subcircuits to be processed distributedly when the test patterns are generated by using the technique of distributed processing along with the technique of circuit division.

These and other objects of the present invention will be apparent to those of skill in the art from the appended claims when read in light of the following specification and accompanying figures.

DESCRIPTION OF THE PREFERRED EMBODIMENTS

Figure 11:
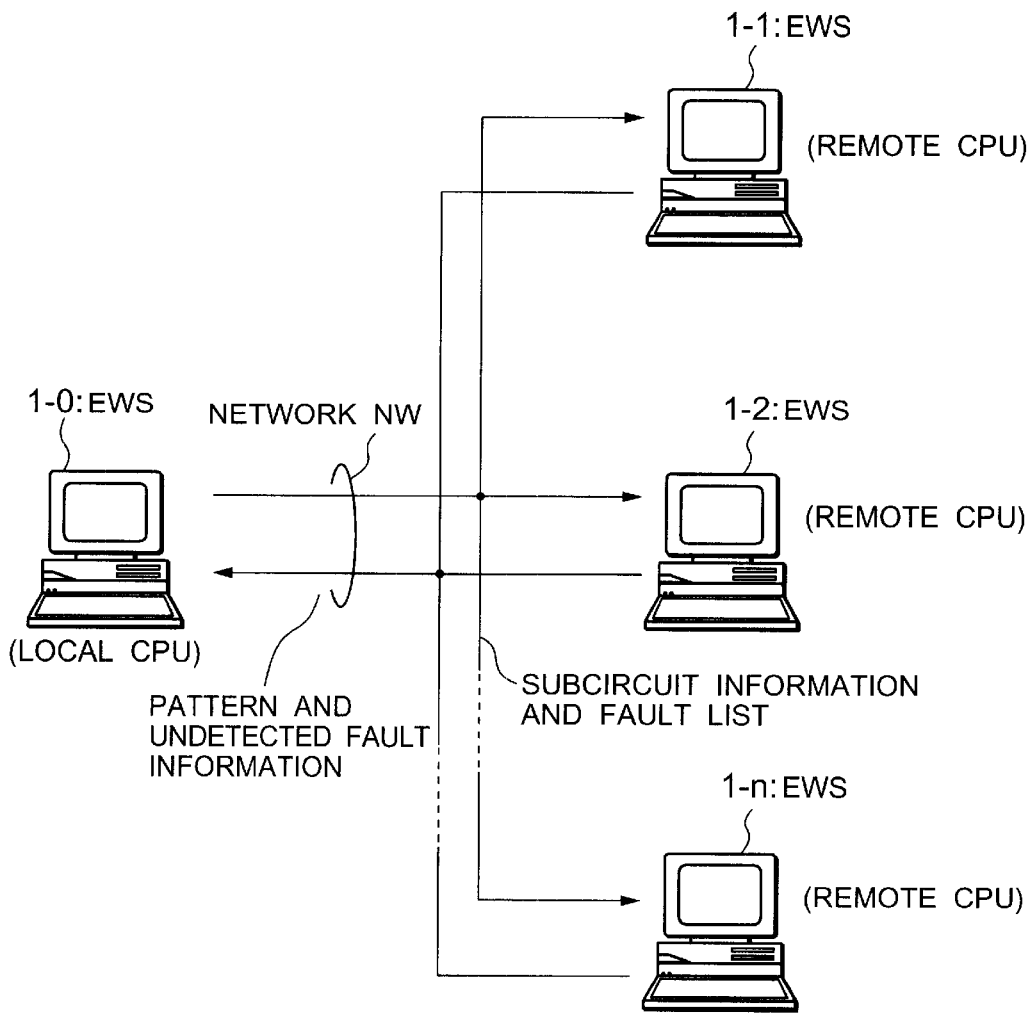
FIG. 11 is a block diagram showing a schematic constitution of the test pattern generating system which distributedly processes the test pattern generation by using the circuit division technique.

Referring to the drawings, the embodiments of this invention will be described in the following. The overall constitution of the test pattern generating system to be disclosed in each embodiment is the same as that of the related system shown in FIG. 11. Moreover, in each embodiment of this invention, a program called test pattern generating program controls the operation of the EWSs 1-0 to 1—n. The test pattern generating program is stored in a computer readable recording medium such as a portable recording medium like a floppy disk, magnetooptical disk, and CD-ROM or a hard disk device built in an EWS or the like.

The test pattern generating program is transferred from the recording medium onto the main memory of the EWSs 1-0 to 1—n under the indication of the local CPU 1L or the remote CPU 1R in starting the test pattern generation. Then, by executing the test pattern generating program on the main memory, the EWSs 1-0 to 1—n control the operation of various parts in the test pattern generating system to realize various kinds of processings that will be described in the following. Since the functions of the local CPU 1L and the remote CPU 1R are widely different, the test pattern generating programs are prepared separately for the EWS 1-0 and for the EWSs 1-1 to 1-n. In that case, the test pattern generating programs may be stored in hard disks built separately in the EWS. Or the test pattern generating programs may be stored collectively in the EWS 1-0, and the test pattern generating programs for the EWSs 1-1 to 1-n may be transferred from the EWS 1-0 respectively to the EWSs 1-1 to 1-n, prior to the start of the test pattern generation processing.

First Embodiment

Figure 1:
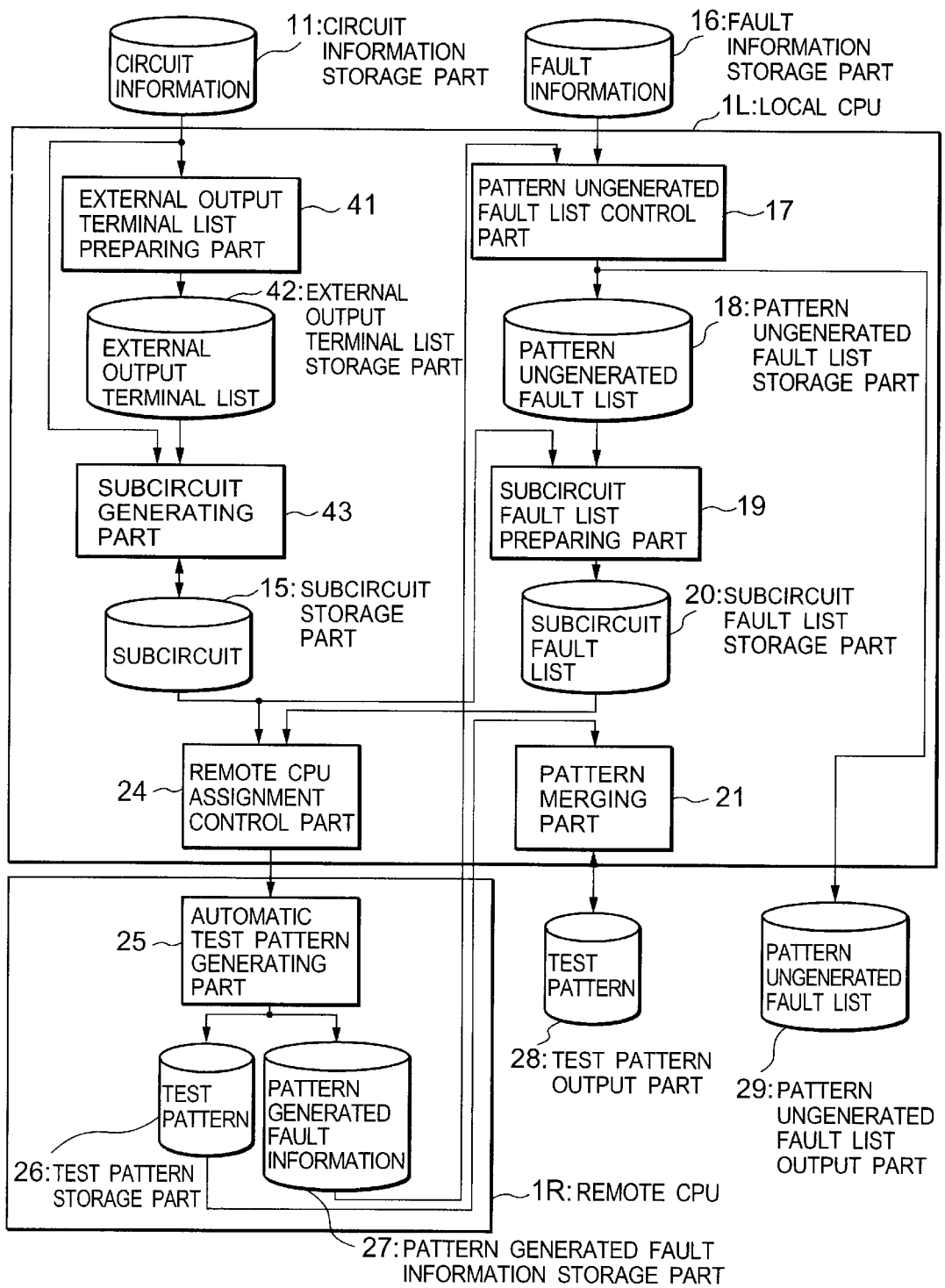
FIG. 1 is a block diagram showing a detailed constitution of the test pattern generating system according to a first embodiment of this invention.
Figure 2:
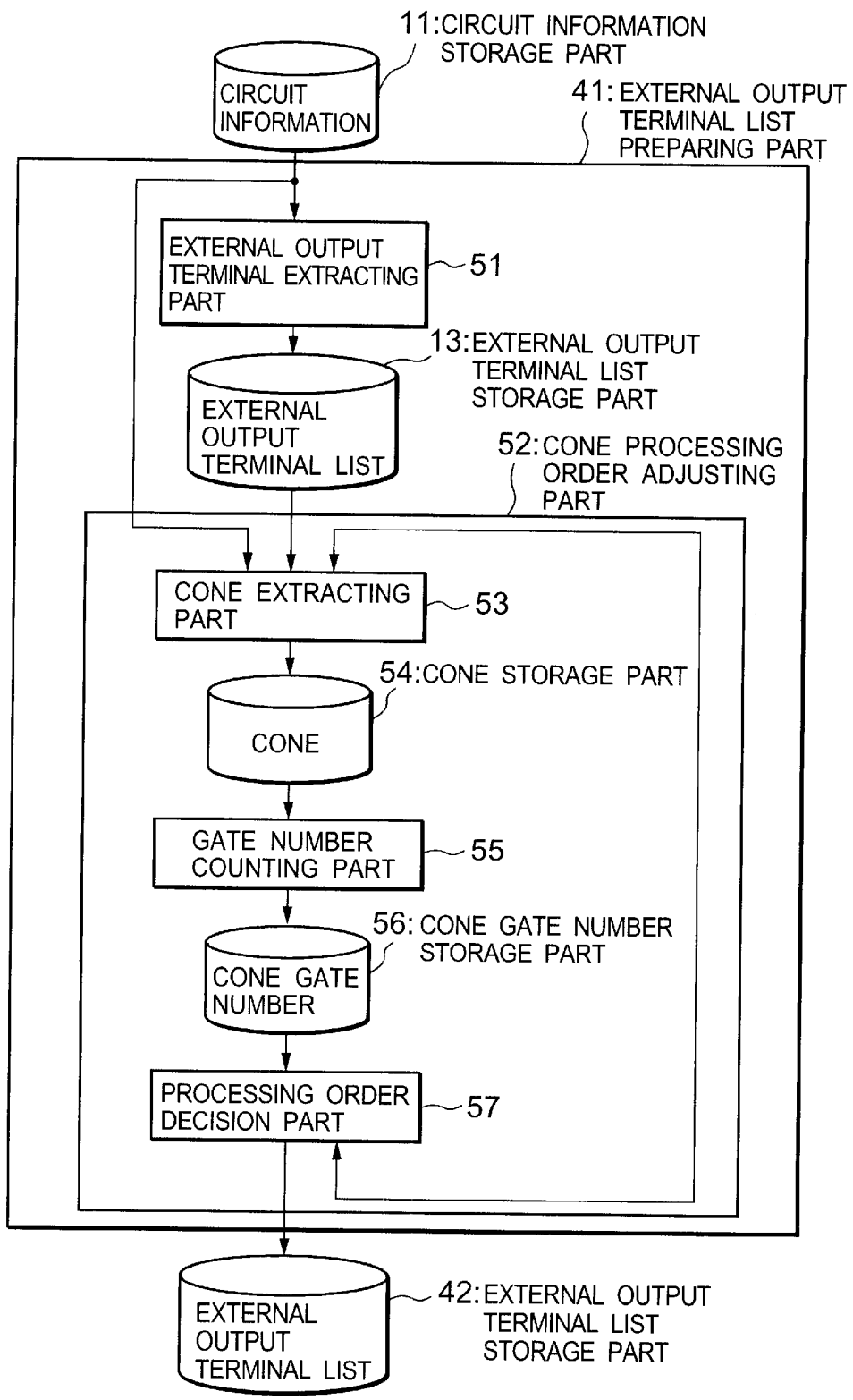
FIG. 2 is a block diagram showing a detailed constitution of the external output terminal list preparing part provided in the test pattern generating system of the first embodiment.
Figure 12:
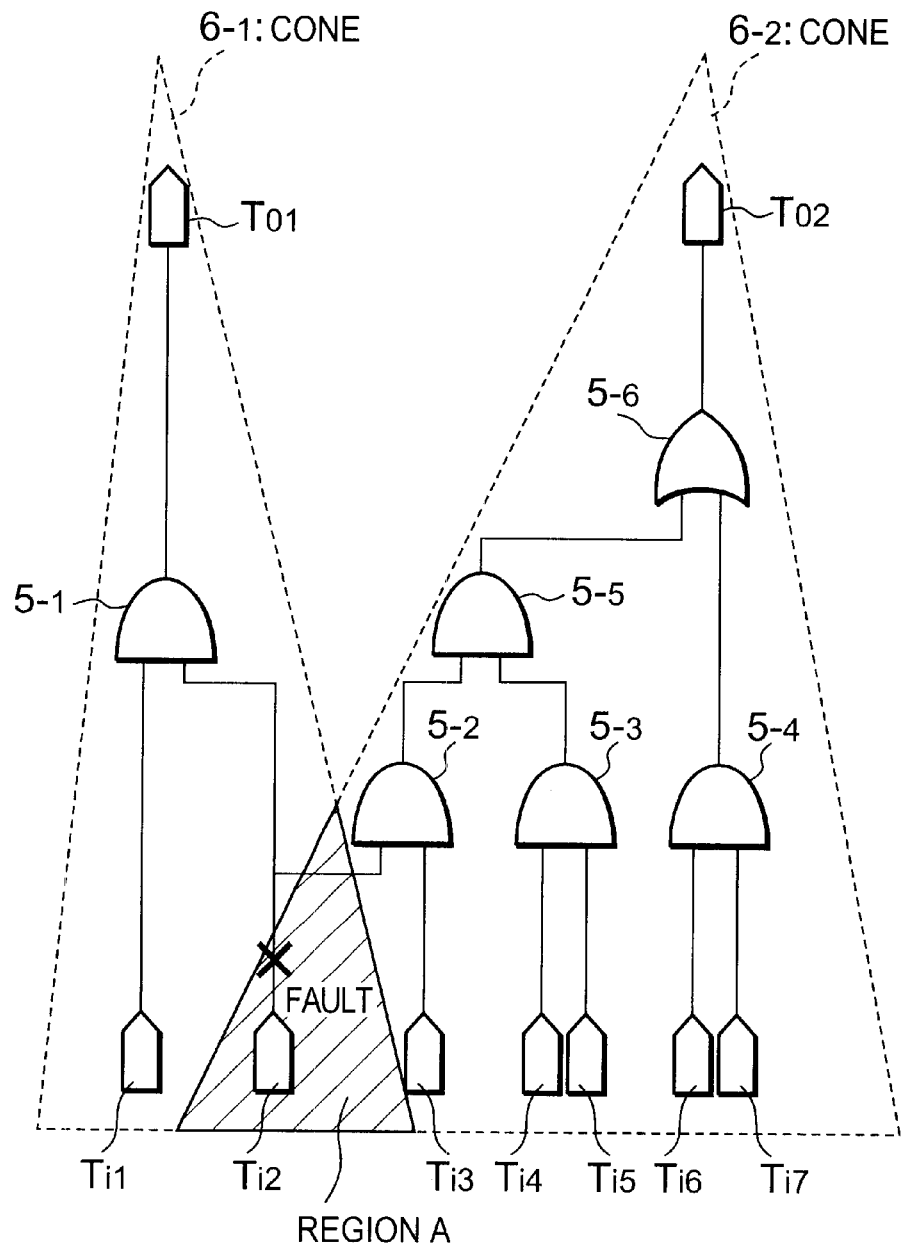
FIG. 12 is a circuit diagram illustrating a part of the circuit which is the object of test pattern generation.
Figure 13:
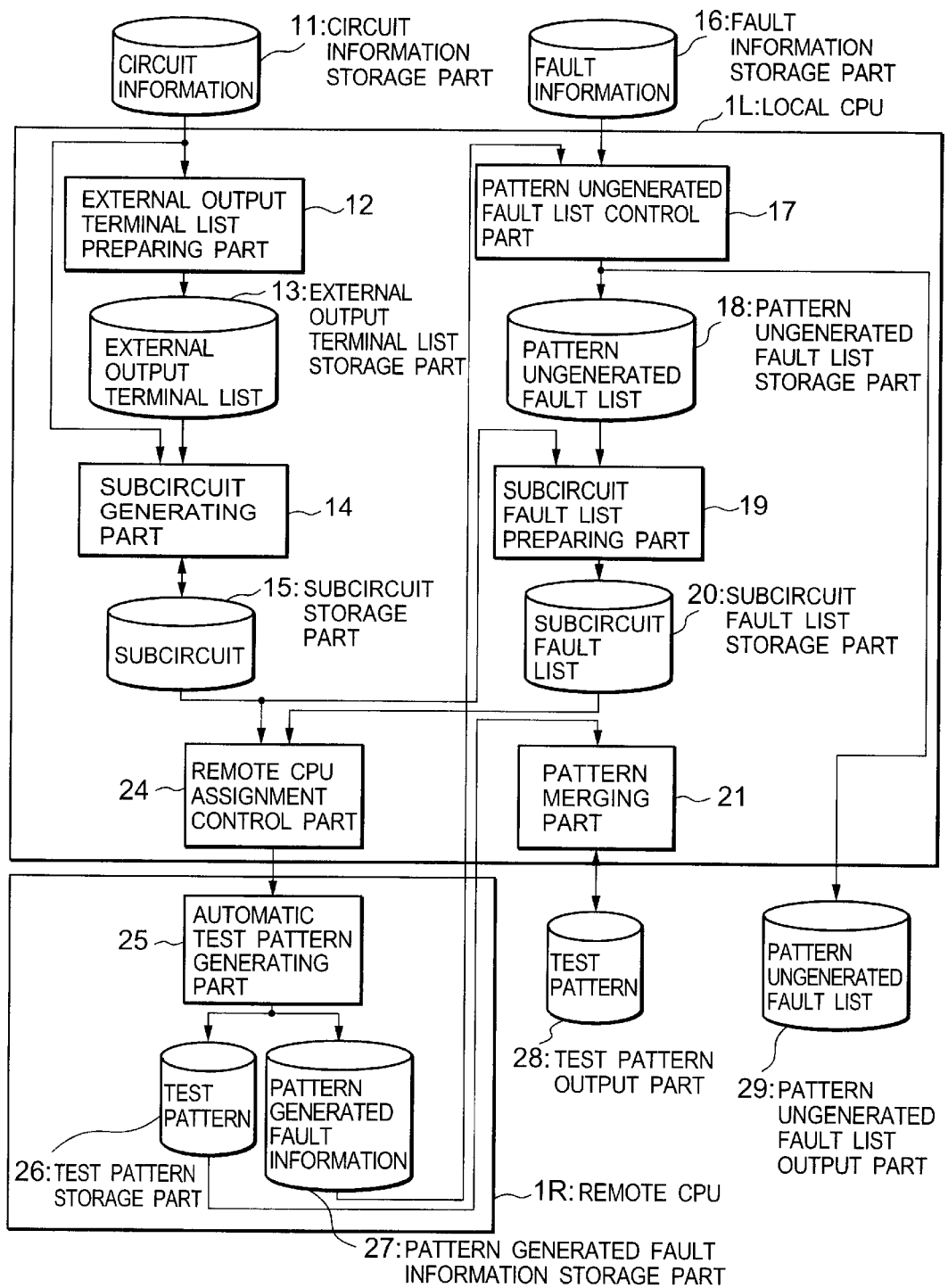
FIG. 13 is a block diagram showing a detailed constitution of a related test pattern generating system to the present invention.

In FIG. 1 which is showing a detailed constitution of the test pattern generating system according to a first embodiment, the constituent elements that are the same as those in FIG. 13 for the related system are given identical symbols. In FIG. 1, an external output terminal list preparing part 41 prepares a list of external output terminals corresponding to respective cones so as to have cones selected sequentially in the ascending order of the estimated processing time for test pattern generation, and stores the list in an external output terminal list storage part 42. Here, referring to FIG. 2, a detailed constitution of the external output terminal list preparing part 41 will be described. First, an external output terminal extracting part 51 has a function similar to that of the external output terminal list preparing part 12 of the Related Art shown in FIG. 12. Namely, the external output terminal extracting part 51 extracts all output terminals from a circuit information stored in the circuit information storage part 11, and stores them in the external output terminal list storage part 13. The external output terminal list storage part 13 is exactly the same one as described in connection with FIG. 13, but in this embodiment, an intermediate external output terminal list is stored in the external output terminal list storage part 13 and the final external output terminal list is stored in the external output terminal list storage part 42.

A cone processing order adjusting part 52 is a circuit for preparing an external output terminal list arranged in ascending order of processing time required for test pattern generation, and each of parts constituting the part 52 will be described next. First, a cone extracting part 53 arbitrarily selects, out of the output terminals stored in the external output terminal list storage part 13, one which has not yet been taken out, finds the circuit information on the cone corresponding to the selected output terminal based on the storage contents of the circuit information storage part 11, and stores the result in a cone storage part 54. When all cones contained in the objective circuit for test pattern generation are taken out, the cone extracting part 53 informs of it to a processing order deciding part 57 (to be described later). A gate number counting part 55 calculates the gate number of cones from the circuit information on the cones stored in the cone storage part 54, and stores the result in a cone gate number storage part 56. In this operation, the gate number counting part 55 also stores information about the cone from which the gate number is calculated, and information indicating the output terminal contained in the cone, to the cone gate number storage part 56.

The cone gate number storage part 56 informs of the operation to the processing order deciding part 57 whenever the storage operation is performed by the gate number counting part 55. The processing order deciding part 57 indicates cone extraction to the cone extracting part 53 whenever it receives notification of storage operation from the cone gate number storage part 56. When notification is received from the cone extracting part 53 that all cones contained in the objective circuit for test pattern generation are taken out, the processing order deciding part 57 sorts the cones in the ascending order of the gate number by referring to the gate number of all cones stored in the cone gate number storage part 56, and stores the output terminals corresponding to respective cones in the order of sorting, in the external output terminal list storage part 42.

Figure 14:
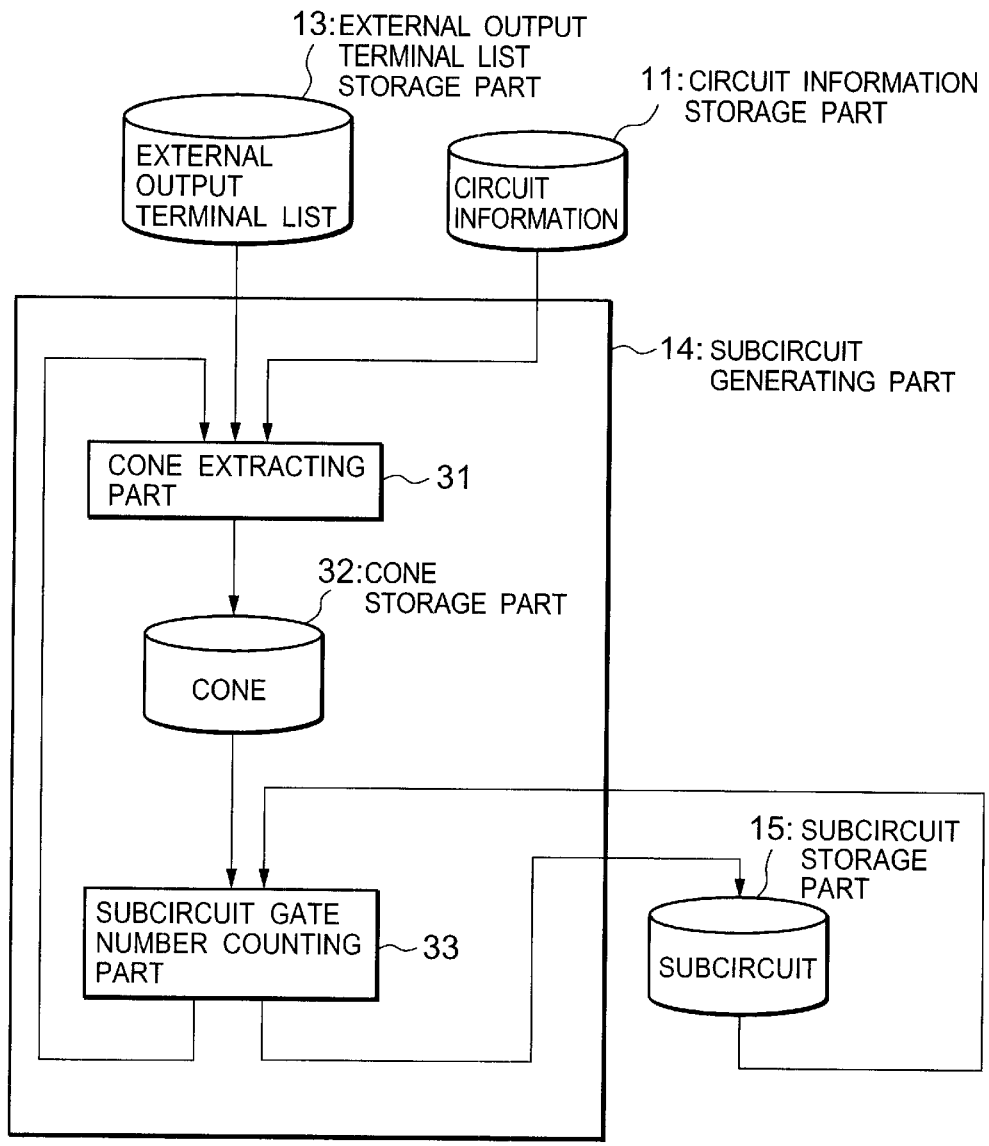
FIG. 14 is a block diagram showing a detailed constitution of the subcircuit generating part provided in the related test pattern generating system.

A subcircuit generating part 43 shown in FIG. 1 has a substantially equivalent constitution and a function as the subcircuit generating part 14 shown in FIG. 13, but is different in the following points. Namely, in contrast to the subcircuit generating part 14 of the Related Art where the cone extracting part 31 (see FIG. 14) selects an output terminal randomly from the external output terminal list storage part 13, the subcircuit generating part 43 of this embodiment, the cone extracting part 53 (corresponding to the cone extracting part 31 in FIG. 14) selects the output terminals in the order in which they are stored in the external output terminal list storage part 42. In other words, in this embodiment, cones are taken out sequentially in the ascending order of the gate number and are stored in the cone storage part 54 (corresponding to the cone storage part 32 in FIG. 14). Here, since the configuration of the subcircuit generating part 43 is substantially the same as that of the subcircuit generating part 14, its illustration will be omitted.

Incidentally, in FIG. 1 the circuit information storage part 11, the fault information storage part 16, the test pattern output part 28, and the pattern ungenerated fault list output part 29 are provided outside the local CPU 1L, but a part or all of them may be incorporated in the local CPU 1L.

Figure 3:
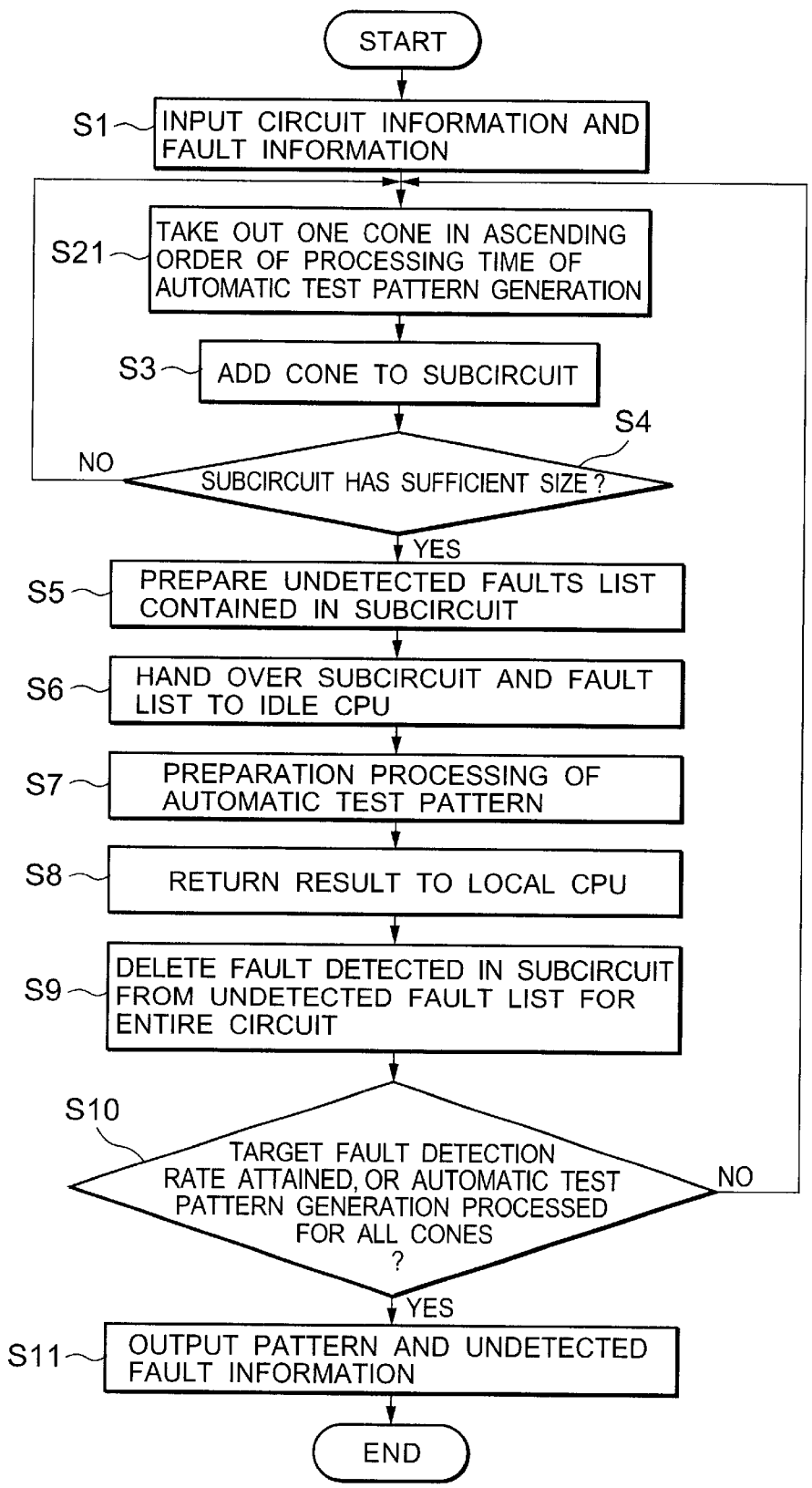
FIG. 3 is a flow chart showing the operation of the test pattern generating system of the first embodiment.
Figure 15:
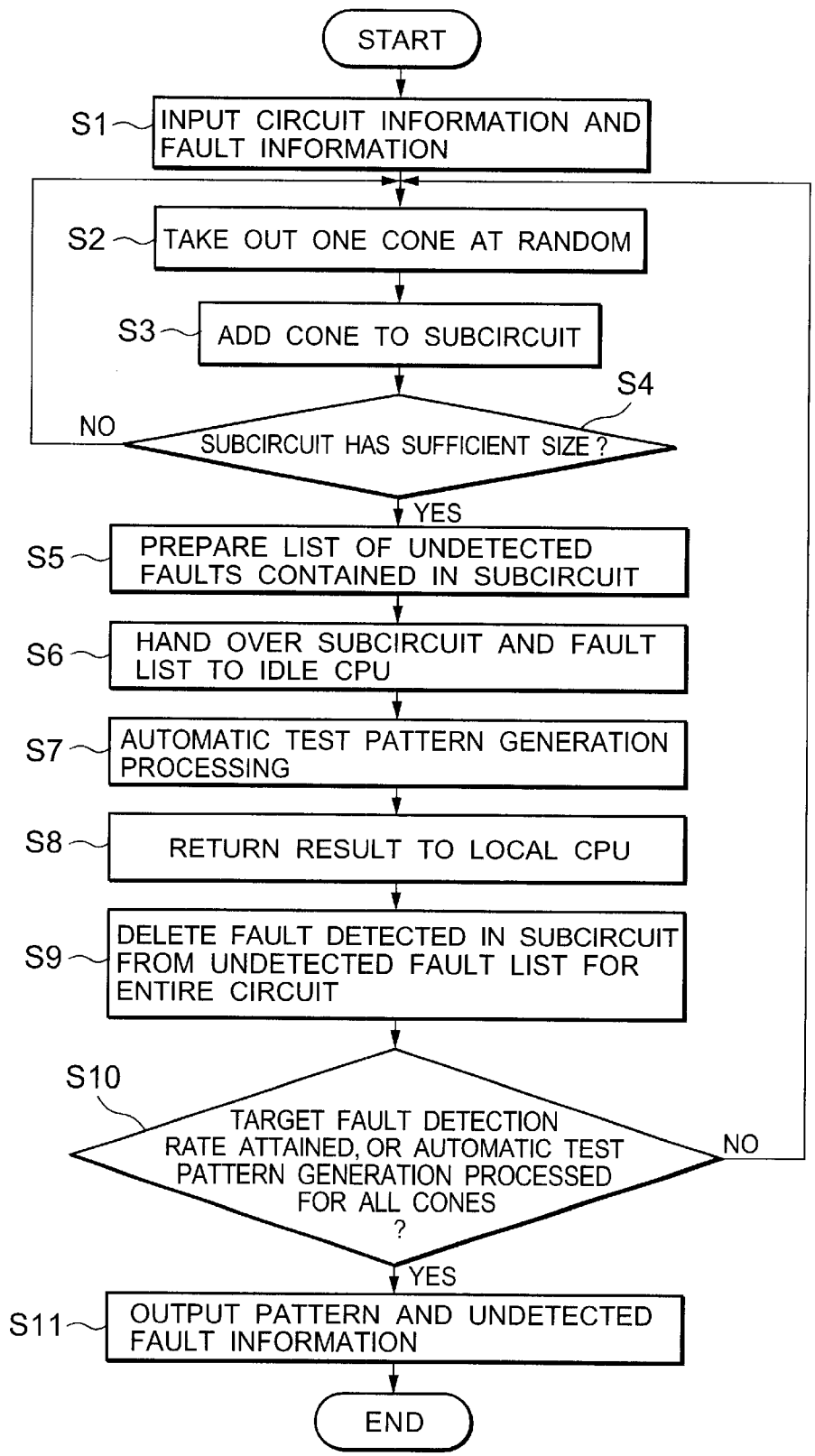
FIG. 15 is a flow chart showing the operation of the related test pattern generating system.
Figure 16:
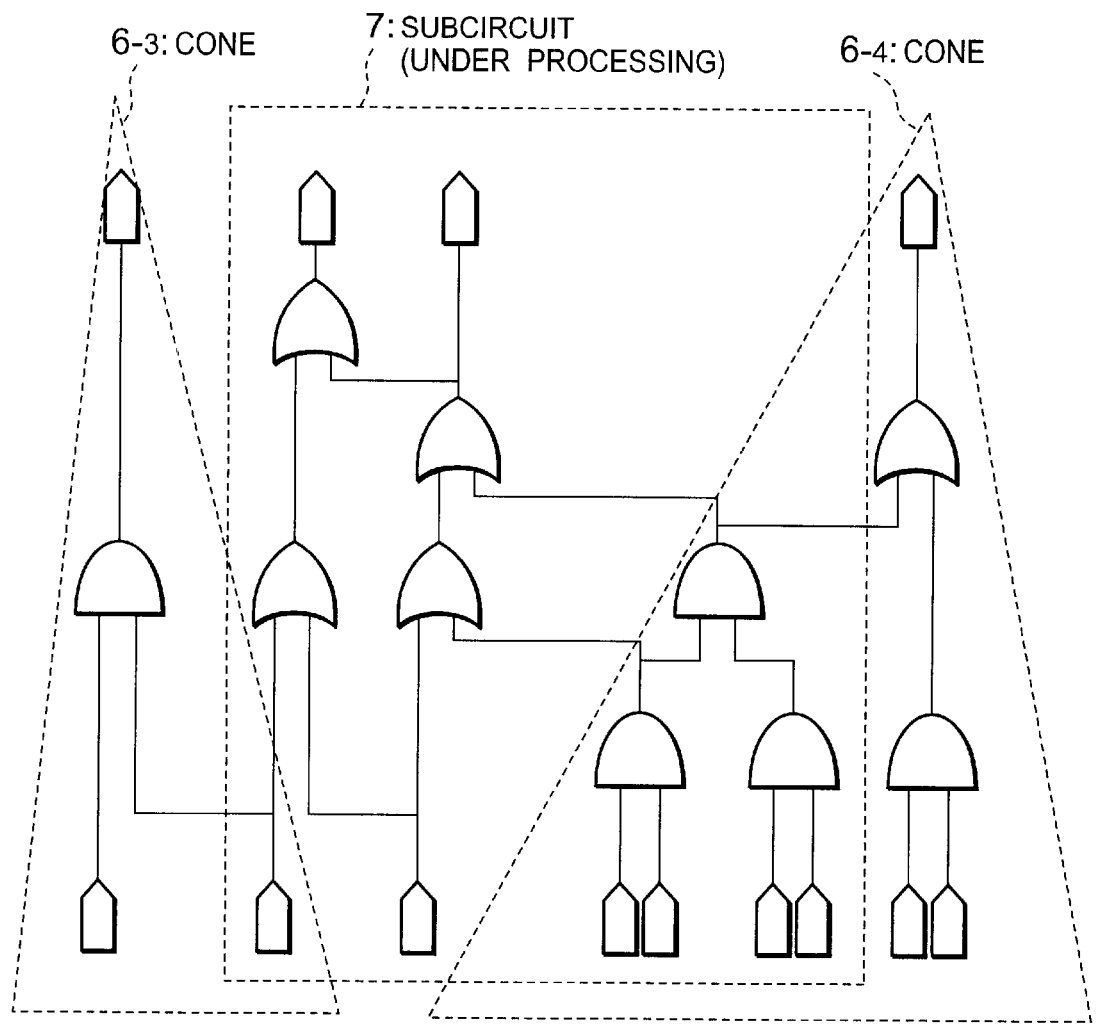
FIG. 16 is an explanatory diagram showing the overlapping situation between a subcircuit in the processing of test pattern generation and a cone which is a candidate of the subcircuit to be added to the subcircuits in generation.

In FIG. 3 showing a flow chart of the procedures for test pattern generation performed in the test pattern generating system of this embodiment, the processing steps the same as in the related method shown in FIG. 15 are given identical step numbers. First, circuit information and fault information related to the entirety of the objective circuit for test pattern generation are stored in the circuit information storage part 11 and the fault information storage part 16, respectively (step S1). Next, when test pattern generation is indicated to the local CPU by operating an input device or the like, not shown, provided in the EWS 1-0, an external output terminal list preparing part 41 performs the following processing. Namely, the external output terminal extracting part 51 (see FIG. 2) stores all output terminals extracted from the circuit information storage part 11 in the external output terminal list storage part 13 to prepare an intermediate external output terminal list. Next, the cone extracting part 53 selects one cone contained in the objective circuit for test pattern generation and stores it in the cone storage part 54. Then, the gate number counting part 55 calculates the gate number of the cone on the cone storage part 54 and stores it in the cone gate number storage part 56.

When the gate number of the cone is stored in this way, the processing order decision part 57 indicates the selection of the next cone to the cone extracting part 53, and thereafter repeats the series of processings just stated.

Then, when all cones existing in the objective circuit for test pattern generation are selected, the gate numbers of all cones are stored in the cone gate number storage part 56. At this point, the processing order decision part 57 sorts all cones in ascending order of the gate number, and arrays the cones in the order of sorting of the output terminals corresponding to respective cones, and stores them in the external output terminal list storage part 42. By so doing, the subcircuit generating part 43 (see FIG. 1) selects the output terminals in the order of storage in the external output terminal list storage part 42. Consequently, the cone with the smallest gate number is selected first, and the subcircuit generating part 43 decides this cone with the smallest gate number as the cone to be added to the subcircuit (step S21).

The processes thereafter are the same as in the related case shown in FIG. 15. Namely, the subcircuit generating part 43 adds a cone selected in step S21 to the subcircuit (step S3), and repeats the loop of steps S21, S3, and S4 until the gate number of the subcircuits reaches the prescribed value (until the decision result of step S4 is "Yes"). As a result of a series of processings, cones in the objective circuit for test pattern generation are added to the subcircuits in ascending order of the gate number, and a subcircuit having gate number almost equal to the subscribed value is obtained. In parallel to these operations, the pattern ungenerated fault list control part 17 prepares a pattern ungenerated fault list for the entire circuit. Thereafter, when the subcircuit generating part 43 stores the subcircuit on the subcircuit storage part 15, the subcircuit fault list preparing part 19 prepares a pattern ungenerated fault list contained in the subcircuit (step S5). The remote CPU assignment control part 24 selects either one of generated subcircuits and hands over the subcircuit information and the fault list to a remote CPU 1R in idle state (step S6) to let it generate a test pattern (step S7). After that, when the result of test pattern generation is sent back from either one of the remote CPUs (step S8), the pattern ungenerated fault list control part 17 deletes the pattern generated fault information from the ungenerated fault list for the entire circuit and calculates the fault detection rate for the entire circuit. In addition, the pattern merging part 21 adds the test pattern sent back to the test pattern output part 28 (step S9). Thereafter, by repeating steps S21 to S10 until the fault detection rate attains the target value or unprocessed cones are exhausted (until the decision result in step S10 is "Yes"), the required test pattern and the pattern ungenerated fault list for the entire circuit are obtained (step S11).

In this embodiment, noting that the processing time for the entire circuit is smaller by processing first subcircuits with shorter processing times for test pattern generation, subcircuits are generated by selecting cones in the ascending order of gate number. As a result, it is possible to shorten the processing time required for generating test patterns for the entire circuit compared with the related method described before. In the above description, the gate number of the cone has been used as an index for estimating the size of the processing time for test pattern generation. The reason for using such an index is that the processing time can be calculated in shorter time without examining the connection relationship between cones or the like.

Accordingly, details of circuit constitution of each cone may be taken into consideration within the tolerable range of the time for CPU to estimate the processing time or the memory capacity, and by so doing, it is possible to estimate the processing time at higher accuracy than in the case of using only the gate number of cone as the index. Besides the gate number of cone, the input terminal number of cone, the step number of gates from input terminal to output terminal, or the exclusive-or gate and exclusive-nor gate number of cone are used as indexes for estimating the size of processing time for test pattern generation. Moreover, in the above description, the information on the cone was held in the form of the external output terminal list in order to suppress the required memory capacity as much as possible, but the circuit information itself of the cone may be held if there is a margin in the memory capacity.

Second Embodiment

Figure 4:
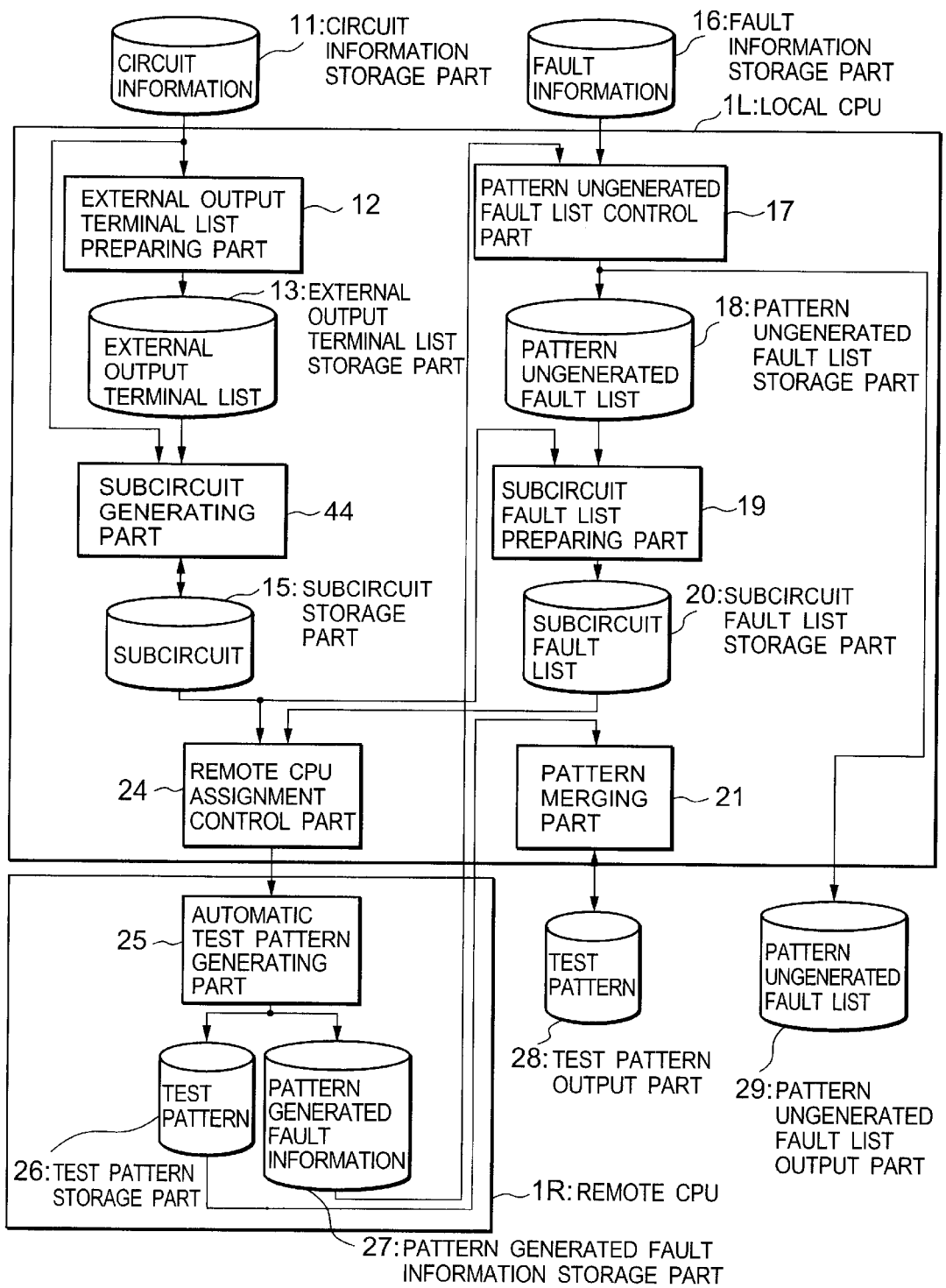
FIG. 4 is a block diagram showing a detailed constitution of the test pattern generating system according to a second embodiment of this invention.

In FIG. 4 which is a block diagram showing a detailed constitution of the test pattern generating system according to a second embodiment of this invention, a subcircuit generating part 44 examines, in generating a subcircuit, the degree of overlap between a cone extracted from the objective circuit for test pattern generation and a subcircuit for which test pattern generation processing is in progress at the time. In this embodiment, the number of overlap of input terminals is used as the degree of overlap. The subcircuit generating part 44 does not add a cone in the subcircuit if its degree of overlap exceeds a certain threshold ("input terminal overlap allowable number" to be described later), and extracts another cone which has not yet been extracted and attempt to add it to the subcircuit. Here, the reason for excluding cones having no overlap with the subcircuit under test pattern processing and allows a certain range of overlap is that the clock signal and some kinds of signal are input in common to a large number of cones, and there are not many cones having absolutely no overlap.

Figure 5:
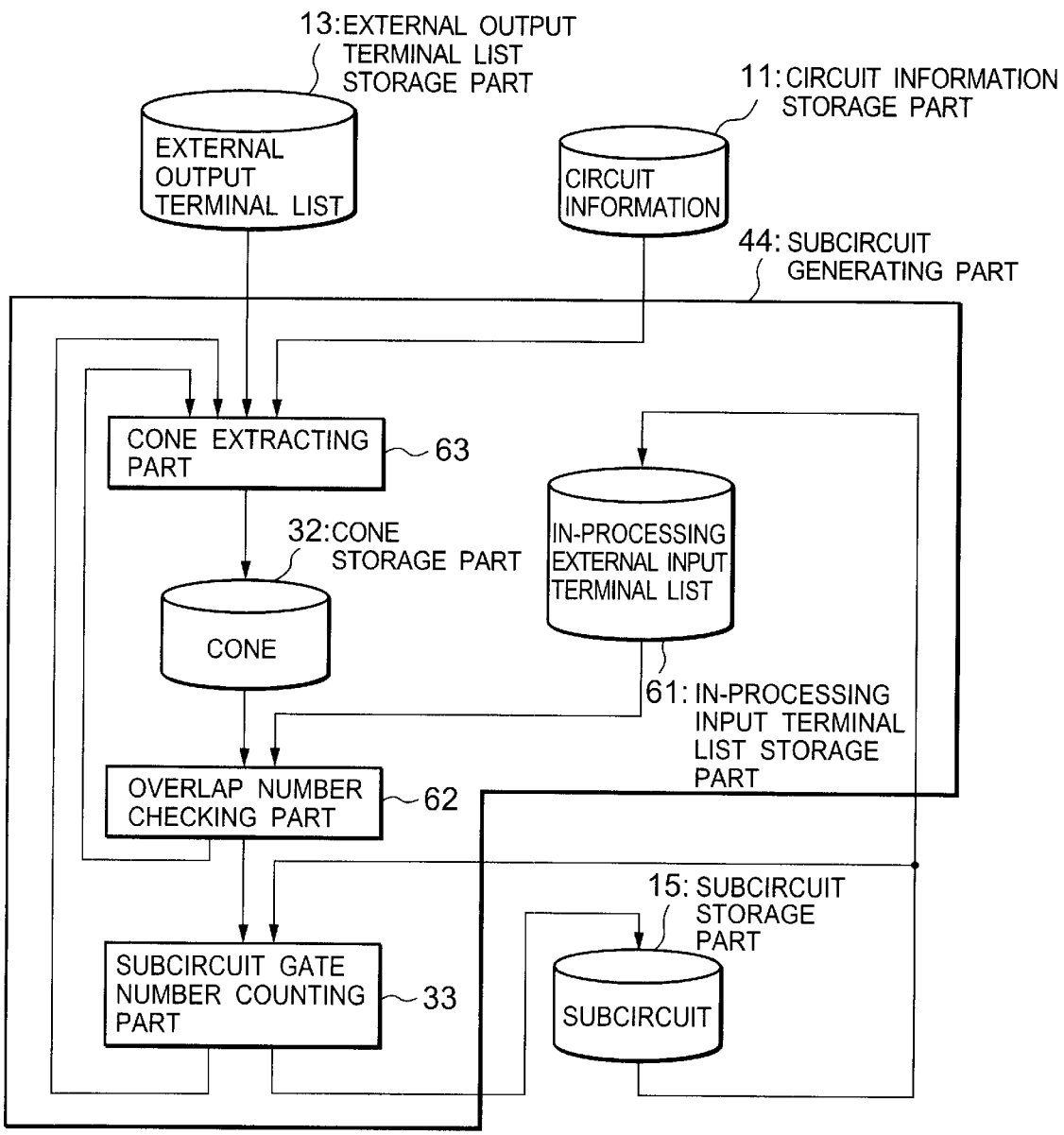
FIG. 5 is a block diagram showing a detailed constitution of the subcircuit generation part in the second embodiment.

Referring to FIG. 5, a detailed constitution of the subcircuit generating part 44 will be described. First, an in-processing external input terminal list storage part 61 is a circuit for storing input terminals included in a subcircuit under process of test pattern generation on the EWSs 1-1 to 1—n (that is, remote CPUs 1R). For this purpose, at the time when the subcircuit gate number counting part 33 detected that the gate number of the subcircuit reached the prescribed value, the storage part 61 acquires the circuit information on the subcircuit from the subcircuit storage part 15, extracts the input terminals from it and adds them to the external input terminal list stored at that point in time. In that case, the storage part 61 also stores assignment information which indicates to which one of the EWSs 1-1 to 1—n the added input terminals are assigned. In addition, when the result of test pattern generation is sent back from some remote CPU 1R, the storage part 61 deletes the input terminals assigned to the remote CPUs from the external input terminal list at that point in time based on the assignment information. At the time of initialization of the test pattern generating system, the storage part 61 initializes its storage contents to the state where no input terminal is registered.

An overlap number checking part 62 takes out a cone extracted by a cone extracting part 63 from the cone storage part 32, and locates the external input terminal list. The checking part 62 discriminates for individual input terminal included in the external input terminal list whether it matches any one in an external input terminal list registered in the storage part 61, and counts the number of matching terminals. Moreover, the overlap number checking part 62 discriminates whether the number of external input terminals matching between the two, exceeds an overlap allowable number. If it exceeds this number, it indicates to the cone extracting part 63 to postpone the processing for the cone extracted in the preceding operation and extract another cone, and reperforms the discrimination for the newly extracted cone. The checking part 62 lets repeated extraction of cones and discrimination processing until the condition is satisfied, at which point sends the cone on the cone storage part 32 to the subcircuit gate number counting part 33.

In the above, what is meant by "postponing" is that a cone which has input terminals exceeding the input terminal overlap allowable number is not included in the subcircuit under generation. Then, since a postponed cone is left without being added to a subcircuit, the postponed cone has to be taken up as a candidate for addition to a subcircuit when another cone is going to be generated later. Accordingly, when notified by the overlap number checking part 62 of the postponement of the cone, the cone extracting part 63 temporarily excludes the cone extracted in the preceding operation from the candidate objects for extraction. The cone extracting part 63 reinstates the postponed cone as a candidate object of the next extraction for subcircuit generation, when notified by the subcircuit gate number counting part 33 of the generation of the subcircuit. The functions of the cone extracting part 63 is the same as that of the cone extracting part 31 of Related Art (see FIG. 14) except for the points just described.

When the number of remaining cones becomes small or the input terminal overlap allowable number is too small, there may arise a case in which there is left no cone which can satisfy the above discrimination condition among cones not added yet to a subcircuit. In such a case, the overlap number checking part 62 changes the input terminal overlap allowable number to a value larger than the current value (for example, to the doubled value of the current one), then reexamines whether there exist cones which do not exceed the changed input terminal overlap allowable number among the cones not yet added to a subcircuit. In this case, since it is necessary to bring out all the postponed cones as the candidate objects for extraction, the overlap number checking part 62 informs of the change in the input terminal overlap allowable number to the cone extracting part 63, and let the part 63 to make the postponed cones to be the candidate objects for extraction again. The value to be set initially as the input terminal overlap allowable number and the magnification (2 in the above) when the allowable number is to be enlarged are approximately set corresponding to the circuit configuration of the object of test pattern generation.

Figure 6:
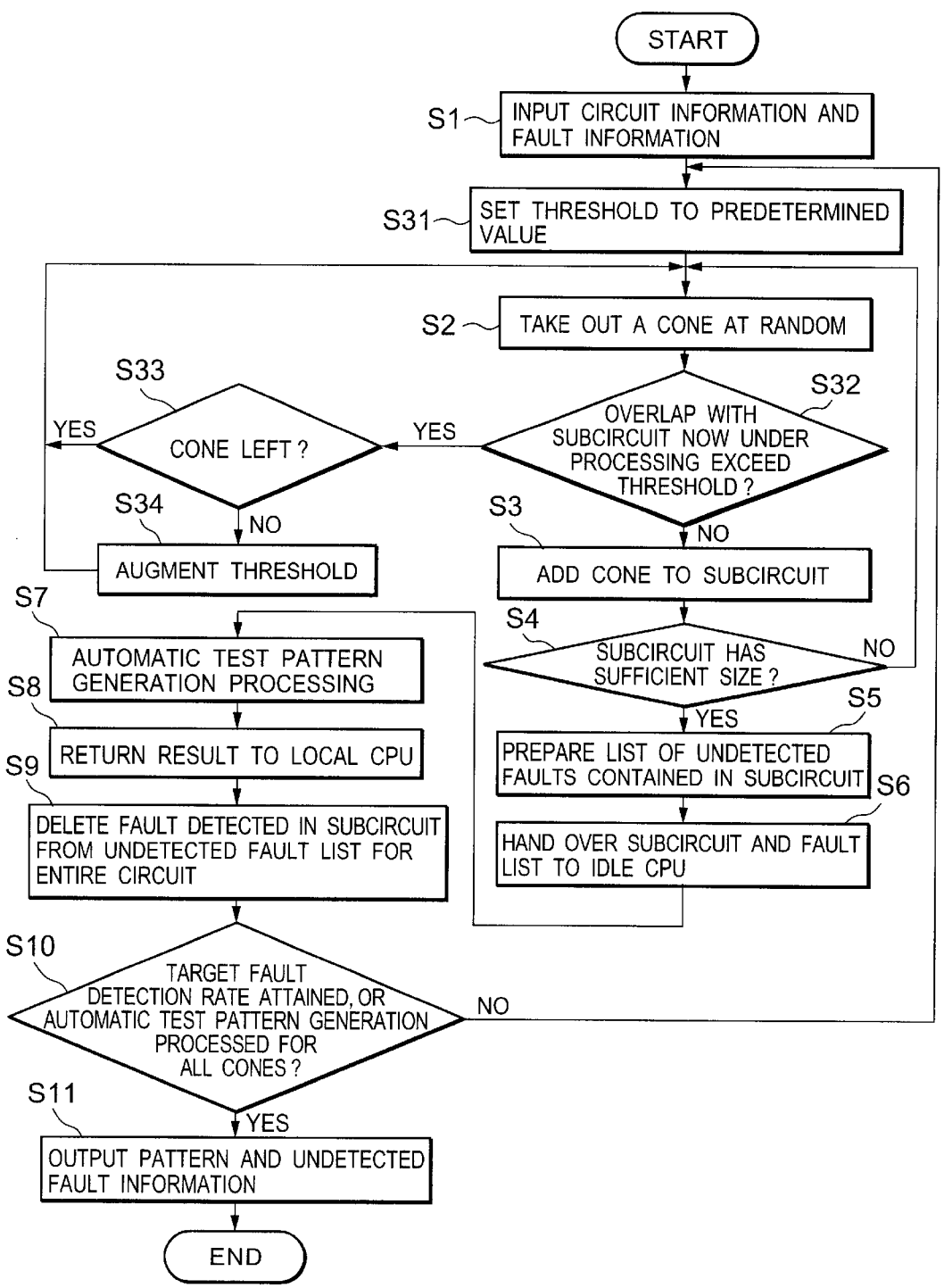
FIG. 6 is a flow chart showing the operation of the test pattern generating system of the second embodiment.

Next, in FIG. 6 showing a flow chart for the procedure of test pattern generation executed in the test pattern generating system of the embodiment, first, circuit information and fault information are set in the circuit information part 11 and the fault information storage part 16, respectively, similar to the related method (step S1). Next, when test pattern generation is indicated to the local CPU 1L, the overlap checking part 62 of the subcircuit generating part 44 initializes the input terminal overlap allowable number ("threshold" in the figure) to a value, "3", for example, set in advance (step S31). In the meantime, the external output terminal list preparing part 12 prepares an external output terminal list for the objective circuit for test pattern generation, similar to the related method, and the cone extracting part 63 of the subcircuit generating part 44 randomly selects one unselected external output terminal from the generated external output terminal list, finds a cone corresponding to the output terminal and stores it in the cone storage part 32 (step S2).

The overlap number checking part 62 takes out a cone from the cone storage part 32, collates the input terminals contained in the cone with an external input terminal list which has been stored in the in-processing external input terminal list storage part 61 to calculate the overlapping input terminal number, and decides whether the number exceeds the input terminal overlap allowable number initialized in step S31 (step S32). In the beginning, there are only a few subcircuits which have undergone test pattern generation among the EWSs 1-1 to 1-n, and in particular, in the first stage of generation of the subcircuit, the decision result of step S32 is necessarily "No". When the overlapping input terminal number is within the allowable range as in this case, the overlap number checking part 62 sends the cone taken out of the cone storage part 32 as it is to the subcircuit gate number counting part 33. Then, the counting part 33 adds the cone sent into the subcircuit to be generated (step S3) as in the related method, calculates its gate number and decide whether the gate number reached the prescribed value (step S4). Thereafter, steps S2 to S4 are repeated until the gate number of the subcircuit under generation reaches the prescribed value (until the decision result of step S4 reaches "Yes") similar to the related method, to obtain a subcircuit with sufficiently large size. In this way, the storage part 61 fetches subcircuit information from the subcircuit storage part 15 to extract an input terminal from it, and adds the input terminal to the external input terminal list stored at the time.

Thereafter, the procedure is substantially the same as in the related method. Namely, in parallel to the processings in step S31 to S4, a pattern ungenerated fault list is prepared. Then, when the subcircuit generating part 44 generates a subcircuit as mentioned above, a pattern ungenerated fault list is prepared (step S5), so the circuit information on the subcircuit and the pattern ungenerated fault list are handed over to a remote CPU in idle state (step S6) and lets it generate a test pattern (step S7). After that, when either one remote CPU 1R returns the result of test pattern generation to the local CPU 1L (step S8), the pattern generated fault information is deleted from the pattern ungenerated fault list for the entire circuit to calculate the fault detection rate for the entire circuit, and merges the test pattern just generated with the existing generated test pattern (step S9). At this time, in this embodiment, the in-processing external input terminal list storage part 61 deletes the input terminals which have been assigned to the remote CPU 1R has sent back the result of test pattern generation from the external input terminal list being stored at the time. The processing in the steps S31 to S10 are repeated until the fault detection rate for the entire circuit attains the target value or unprocessed cones are exhausted (step S10), and finally output the test pattern and the pattern ungenerated fault list (step S11).

When subcircuits are assigned sequentially to remote CPUs in idle state in this manner, there may arise a situation in which the overlap number between the input terminals of an extracted cone in step S2 and the external input terminal list of a subcircuit under generation, exceeds the input terminal overlap allowable number, and the decision result of step S32 becomes "Yes". In such a case, the overlap number checking part 62 inquires the cone extracting part 63 whether there are still left cones that are not yet extracted (step S33). If there are still left such cones (the decision result of step S33 is "Yes"), the overlap checking part 62 lets the cone extra g part 63 to postpone the processing for the cone extracted in the immediately preceding step S2, and reselect either one of the cones which have not yet been extracted. Thereafter, while the decision result of step S32 is "Yes", cones extracted by the repetition of the steps S2, S32, and S33 are postponed. At the time when the decision result of step S32 became "No", the overlap number checking part 62 sends the extracted cones to the subcircuit gate number counting part 33, and executes the processings following step S3 as described above.

Here, while repeating the loop consisting of steps S2, S32, and S33 there may arise a situation in which there exists no cone satisfying the condition of step S32 (situation in which the decision result of step S33 is "No") among unextracted cones. In such a case, the overlap number checking part 62 changes the input terminal overlap allowable number to, for example, 6 which is twice as large the current value (step S34), and while selecting either one of the cones (step S2) from among the cones, including the postponed cones, not yet added to the subcircuits, continues to examine whether the cone satisfies the condition of step S32. When the selected cone does not satisfy the condition of step S32, new cones are extracted sequentially, and if unextracted cones are exhausted, the input terminal overlap allowable number is further increased.

As in the above, in this embodiment, when subcircuits distributedly processed overlap with each other, test pattern generation processing is made more efficient by choosing their overlap as small as possible, and as a result, the efficiency of test pattern generation by distributed processing is enhanced compared with the related method. In the above description, the external input terminal number has been used as an index of the degree of overlap between the subcircuit under processing and the extracted cone, but the use of various other indices are also conceivable. Thus, for example, within the range of the time required by the CPU for calculating the degree of overlap and the memory capacity, the gate number of the logic gates that overlap with each other may be used as the index. By employing such an index, it is possible to evaluate the degree of overlap with higher accuracy compared with the case of simply using the overlap number of the external input terminals.

Third Embodiment

Figure 7:
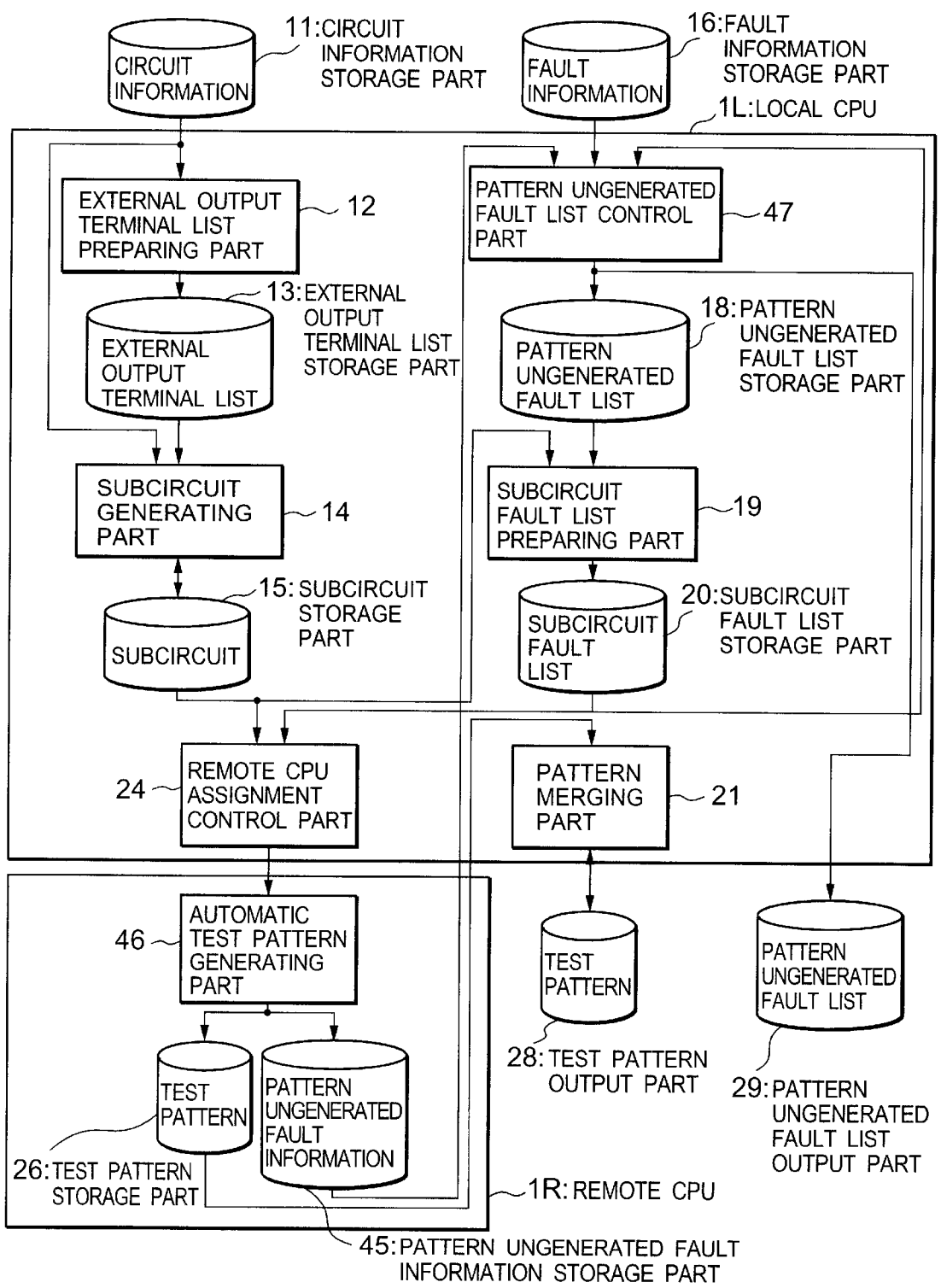
FIG. 7 is a block diagram showing a detailed constitution of the test pattern generating system according to a third embodiment of this invention.

FIG. 7 is a block diagram showing a detailed constitution of the test pattern generating system according to this embodiment. In this embodiment, a pattern ungenerated fault information storage part 45 is provided in place of the pattern generated fault information storage part 27 in FIG. 13. The storage part 45 is a circuit for storing fault information which is needed as a processing object in a later test pattern generation in the fault list handed over from the local CPU 1L. Namely, such a fault information excludes, among the pieces of fault information for which test patterns were not generated in the automatic test pattern generating part 46, faults which became clear that test pattern cannot be generated in all cones and faults which are discriminated that the test pattern generation is difficult and hence the processing should be dropped. In the meantime, the automatic test pattern generating part 46 of this embodiment differs from the related automatic test pattern generating part 25 shown in FIG. 13 in the point that it is not for outputting a pattern generated fault information but for outputting a fault information for which a pattern generation was not possible.

In addition, in this embodiment, a pattern ungenerated fault list control part 47 is provided in place of the pattern ungenerated fault list control part 17 shown in FIG. 13. The control part 47 fetches a fault list from the subcircuit fault list storage part 20 at the time when the list of faults contained in a subcircuit is generated, and at that point deletes the fault list for the subcircuit from the pattern ungenerated fault list for the entire circuit. In other words, when there is an overlap between a certain subcircuit and a subcircuit to be generated later, the test pattern generation of the overlapping fault is carried out using subcircuits generated earlier. Accordingly, in this embodiment, there occurs no situation in which the same fault is processed simultaneously on a plurality of remote CPUs. In addition, the pattern ungenerated fault list control part 47 fetches pattern ungenerated fault information sent from the remote CPU 1R and adds it to the pattern ungenerated fault list stored at the time.

Figure 8:
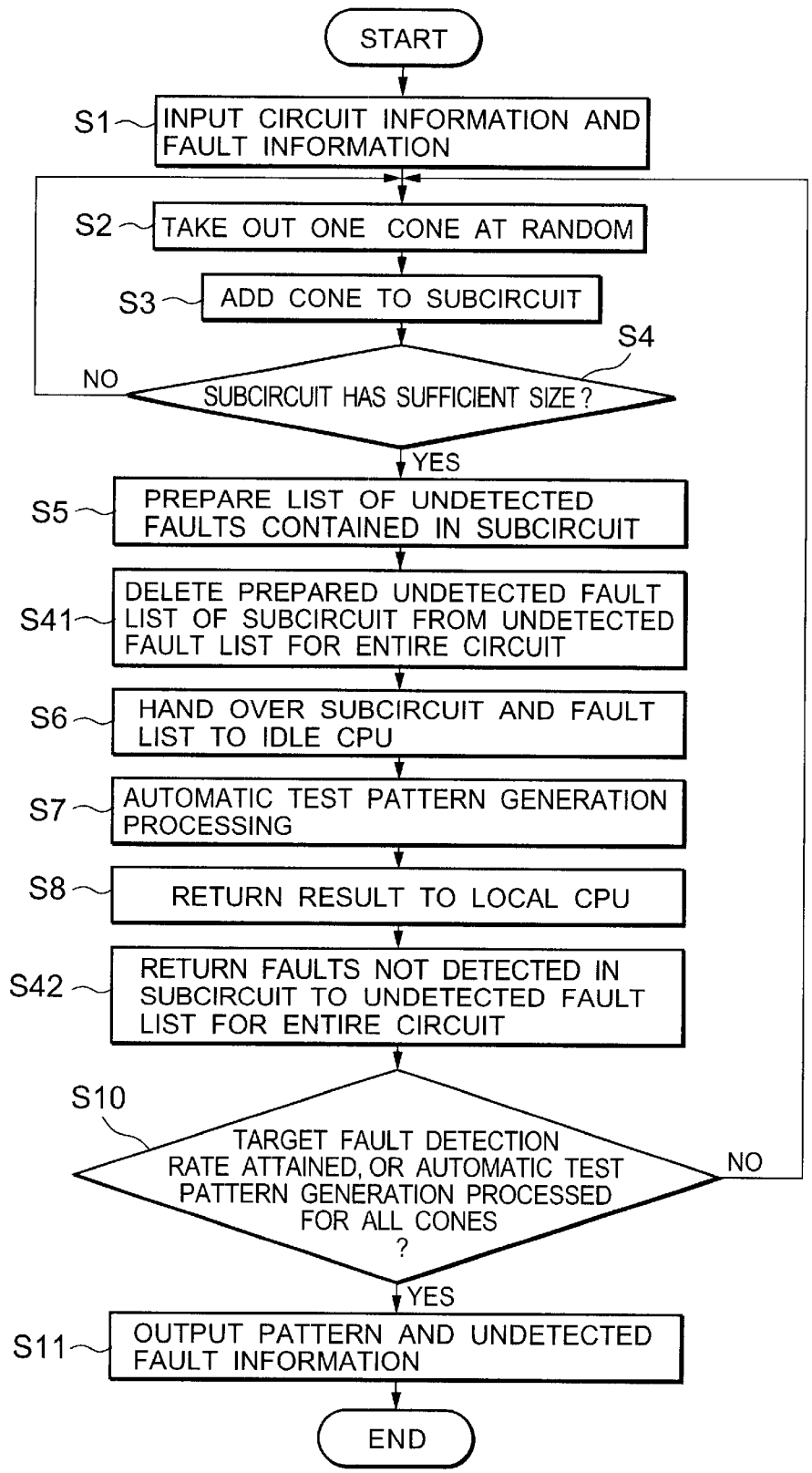
FIG. 8 is a flow chart showing the operation of the test pattern generating system according to the third embodiment.

In FIG. 8 which is a flow chart showing the procedure of test pattern generation performed in the test pattern generating system of this embodiment, first, the processings in each of the steps S1 to S5 are identical to those of the related method. Namely, after setting circuit information and fault information (step S1), when test pattern generation is designated, an external output terminal list for the entire circuit is prepared, and repeats the operation of randomly selecting an unselected external output terminal to find a corresponding cone (step S2) and adding it to the subcircuit (step S3) until the gate number of the subcircuit reaches the prescribed value (step S4). In the meantime, a pattern ungenerated fault list for the entire circuit is prepared in advance based on the set fault information, and prepares a pattern ungenerated fault list contained in the subcircuit at the time when the subcircuit is generated (step S5).

When the fault list contained in the subcircuit is prepared in this manner, the pattern ungenerated fault list control part 47 fetches the subcircuit fault list just prepared from the subcircuit fault list storage part 20, and deletes the subcircuit fault list from the pattern ungenerated fault list for the entire circuit stored in the pattern ungenerated fault list storage part 18 (step S41). In this case, imagining, for example, the circuit configuration shown in FIG. 12, assume that the subcircuit including the cone 6-1 is assigned to the EWS 1-2 and, at a certain later time, the subcircuit including the cone 6-2 is assigned to the EWS 1-1. In that case, fault information existing in the cone 6-1 including fault information for the region A is first handed over to the EWS 1-2, and fault information for the portion excluding the region A is handed over to the EWS 1-1 at a later time.

Then, when the remote CPU assignment control part 24 hands over generated circuit information and fault information to a remote CPU 1R in idle state (step S6), the automatic test pattern generating parts 46 in the remote CPU 1R starts test pattern generation. After that, when test pattern generation is completed in some remote CPU 1R, the automatic test pattern generating part 46 stores the generated test pattern in the test pattern storage part 26 in the same way as in the related method, and determines a list of faults for which test patterns were not generated and stores it in the pattern ungenerated fault information storage part 45. Following this, the CPU 1R sends back to the local CPU 1L the test pattern and the pattern ungenerated fault information (step S8).

Then, the pattern ungenerated fault list control part 47 adds the pattern ungenerated fault information sent back from the remote CPU 1R to the pattern ungenerated fault list stored at that time in the pattern ungenerated fault list storage part 18 (step S42). By so doing, the faults for which test patterns were not generated by the remote CPU 1R are given the possibility of having their test patterns generated in the test pattern generation processes for subcircuits that will be generated sequentially later. The operations after this are the same as in the related method. Namely, the pattern ungenerated fault list control part 47 calculates the fault detection rate for the entire circuit based on the pattern ungenerated fault list where the pattern ungenerated fault information of the subcircuit is added. In addition, the pattern merging part 21 adds the test pattern sent back from the remote CPU 1R to the storage contents of the test pattern output part 28. Then, the loop consisting of the steps S2 to S10 is repeated until the calculated fault detection rate attains the target value or unprocessed cones are exhausted (step S10), and finally the test pattern and the pattern ungenerated fault information are output (step S11).

According to this embodiment, when there exists a fault which can be detected only by a specific cone, there may occur a case in which a test pattern cannot be generated for that fault. For example, assume that the faults in the region A shown in FIG. 12 can only be detected by the cone 6-1. In this case, assume further that a subcircuit including the cone 6-2 is assigned to the EWS 1-2, then a subcircuit including the cone 6-1 is assigned to EWS 1-1, and perform test pattern generation processing for the two subcircuits in parallel. In that case, at the time when the subcircuit including the cone 6-2 is generated, the pattern ungenerated fault list control part 47 deletes the information included in the region A from the pattern ungenerated fault list storage part 18. Accordingly, at the time when the subcircuit including the cone 6-1 is to be generated later, the faults included in the region A are not treated as being test patterns ungenerated faults, and they are not included in the fault list for subcircuits to be handed over to the EWS 1-1. For these circumstances, the faults in the region A are not detected by the EWS 1-1 which processes the cone 6-1. In the meantime, since the faults in the region A can be detected only by the cone 6-1, the EWS 1-2 will not detect the faults. Accordingly, even if the EWS 1-2 completes test pattern generation and returns the faults to the pattern ungenerated fault list storage part 18 as pattern ungenerated information, a test pattern will never be generated by any of the following cones.

The above situation can also happen when a certain fault is judged to be redundant in one cone, whereas it is judged to be not redundant in another cone. Namely, it is a case where the fault is not redundant when seen from the circuit as a whole, but it is redundant when seen confined in a specific cone. In such a case, a problem arises when a subcircuit that includes the former cone is generated first, and a subcircuit that includes the latter cone is generated latter, and both cones are processed distributedly. The reason for this is that, since the fault is temporarily excluded from the pattern ungenerated fault list for the entire circuit at the time when the subcircuit for the former cone is generated, it will not be included in the subcircuit for the latter cone. Accordingly, as a result of the test pattern generation processing, the fault is regarded to be redundant in the former cone whereas the fault is not regarded as an object of test pattern generation in the latter cone, and eventually a test pattern for the fault will never be generated.

However, even though there exist faults for which test patterns are not generated for the above reasons, they will not cause problems at all. That is, generally speaking, it is not always required that the fault detection rate for the entire circuit be 100%, and it is known statistically that an LSI of test object will not cause a problem if no faults is found by using a test pattern which gives a fault detection rate of, for example, about 95% (see step S10 in FIG. 8). Accordingly, it suffices if a test pattern which gives a fault detection rate on the order of the above level is generated, and the presence of several faults which are detectable only by specific cones will not give rise to practical difficulties.

As in the above, in this embodiment, when there exists an overlapping region between subcircuits, the undetected fault list for the region is arranged to be deleted from the undetected fault list for the entire circuit at the time when the subcircuit is generated. Consequently, a situation in which a plurality of remote CPUs simultaneously generate test patterns for the faults in the region can be avoided. As a result, the efficiency of test pattern generation by distributed processing is further enhanced.

Figure 9:
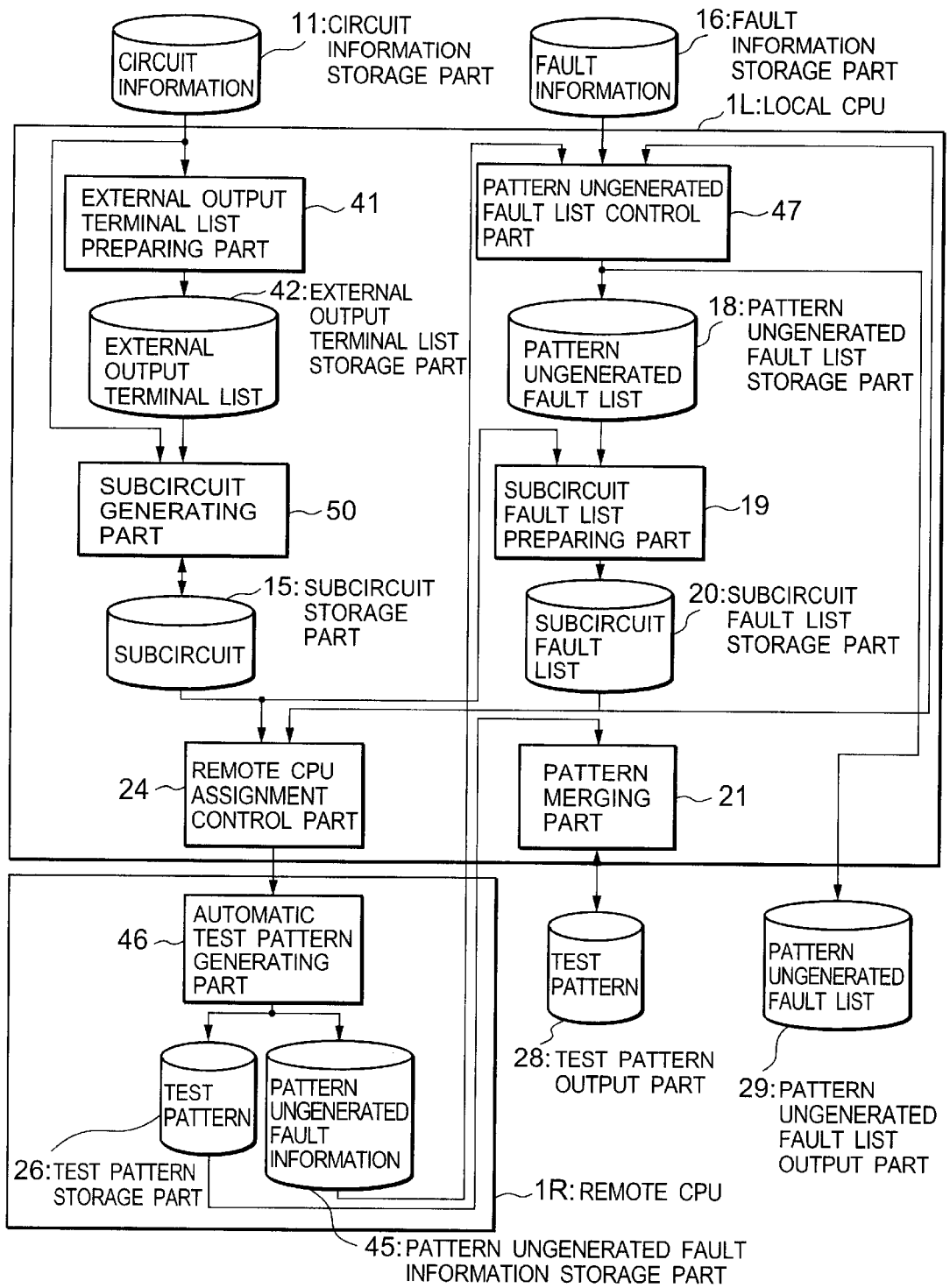
FIG. 9 is a block diagram showing a detailed constitution of a test pattern generating system when the first to third embodiments of this invention are combined.

Now, of the first to third embodiments in the above, two or all three embodiments may be combined. The constitution and the operation when these embodiments are combined will be obvious from the description in the above and FIG. 1 to FIG. 8. To make it sure, however, the case of combining all of the three embodiments will be described below. FIG. 9 is a block diagram showing the constitution of the test pattern generating system when the first to third embodiments are combined. In FIG. 9, a subcircuit generating part 50 is a circuit equipped with a function which is the combination of the functions of the subcircuit generating part 43 (first embodiment) in FIG. 1 and the subcircuit generating part 44 (second embodiment) in FIG. 4. Namely, the cone extracting part 63 shown in FIG. 5 does not select the external output terminals at random, but selects them in the ascending order of the cone gate number which is stored in the external output terminal list storage part (that is, the external output terminal list storage part 42 shown in FIG. 9).

Figure 10:
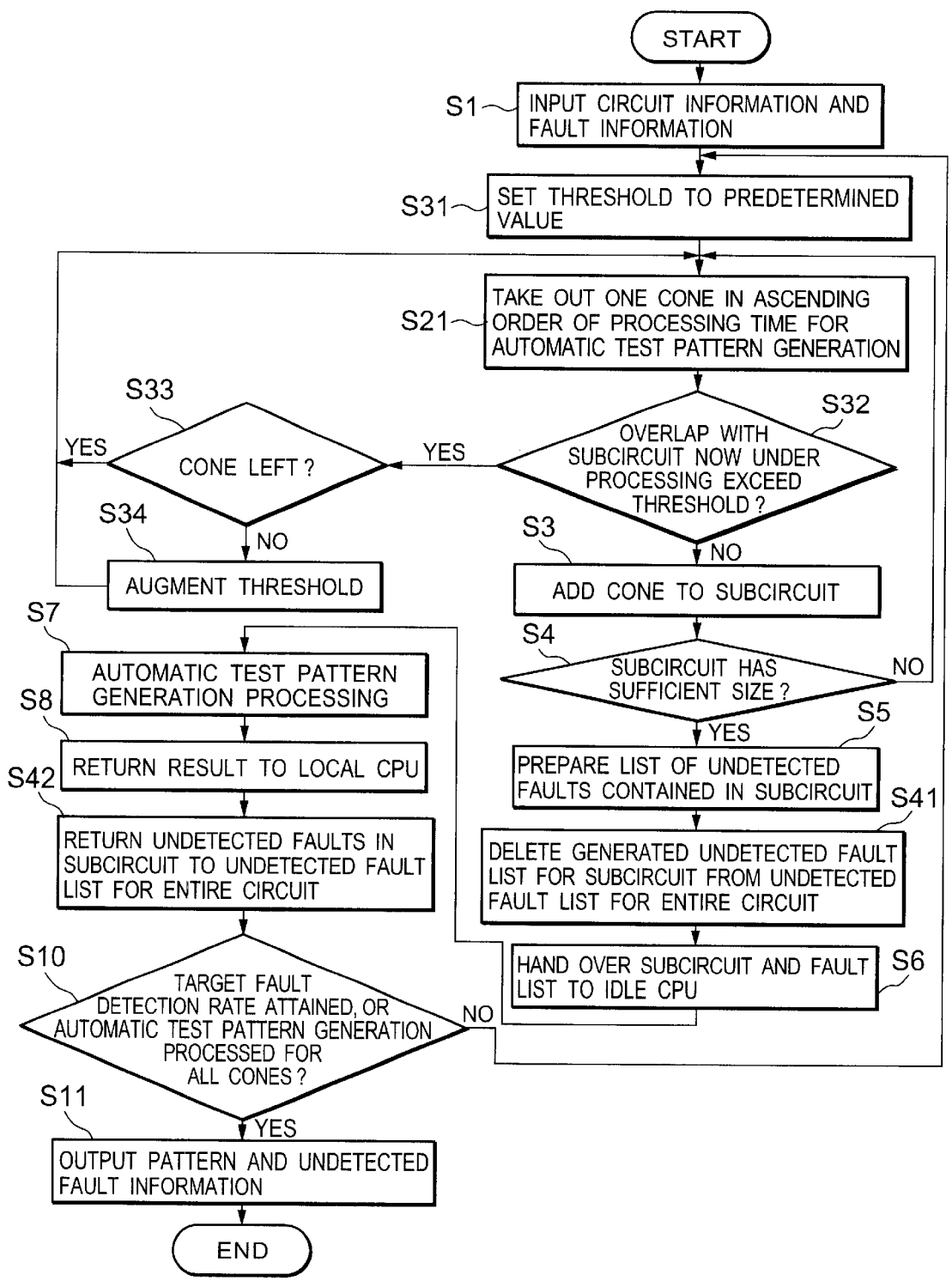
FIG. 10 is a flow chart showing the operation of the test pattern generating system which is the combination of the first to third embodiments of this invention.

FIG. 10 is a flow chart showing the operation of the test pattern generating system shown in FIG. 9, and its brief description will be given in the following. First, after setting circuit information and fault information (step S1), cones included in the objective circuit for test pattern generation are sorted in the ascending order of the gate number, and an external output terminal list corresponding to the cones and a pattern ungenerated fault list are prepared. Moreover, the input terminal overlap allowable number is initialized to the predetermined value (step S31). Then, a cone is taken out according to the ascending order of the gate number (step S21), and the number of input terminals in the mutually overlapped region between the cone and the subcircuit under processing by each CPU is determined (step S32). If the overlapping terminal number exceeds the input terminal overlap allowable number, the cone is postponed, and reextraction of the next cone and addition of the cone that satisfies the condition of step S32 to the subcircuit (step S3) is continued. In this case, when there exists no cone that satisfies the condition of step S32 (step S33), cone selection is attempted again by increasing the input terminal overlap allowable number (step S34). That is, since the gate number of the cone is statically determined, the processing order of cones is determined without change based on the gate number, distributed processing by a plurality of remote CPUs is started. After that, the processing order of cones is dynamically changed while considering the degrees of overlap between the cones and subcircuits under test pattern generation.

At the time when the gate number of the subcircuit reached the prescribed value (step S4) an undetected fault list contained in the subcircuit is prepared (step S5), and excludes this list temporarily from the undetected fault list for the entire circuit (step S41). Next, the circuit information and the undetected fault list of the generated subcircuit are handed over a remote CPU 1R in idle state (step S6) to let it generate a test pattern (step S7). With the above procedure, subcircuit in the objective circuit for test pattern generation is generated sequentially and the circuit information and the undetected fault list for the subcircuit are handed over correspondingly. When some remote CPU completes test pattern generation (step S8), the local CPU 1L receives the generated test pattern to accumulate, and returns the faults for which test patterns could not be generated by the remote CPU 1R to the undetected fault list for the entire circuit (step S42). Thereafter, a series of processings as described in the above are executed for each subcircuit. When the fault detection rate for the entire circuit attains the target value or cones to be processed in the objective circuit for test pattern generation are exhausted, test pattern generation for the entire circuit is completed, and the test pattern and the pattern undetected fault list become extractable (step S11).

As described in the above, it is an advanced feature related to the first embodiment, when test patterns are generated for subcircuits obtained by dividing the entirety of the objective circuit for test pattern generation, cones are arranged in ascending order of the processing time required for test pattern generation, and each subcircuit is generated by selecting and collecting the cones according to this order. With this procedure, when the same faults are included in a plurality of subcircuits due to overlap of the subcircuits, test pattern generation for the faults in the overlapped portion is attempted first using a subcircuit with smaller estimated processing time, and the fault list for the subcircuit for which test pattern was generated is deleted from the undetected fault list for the entire circuit. Later, at the time when a test pattern for a subcircuit with larger estimated processing time is to be generated, test pattern will not be generated again for the faults in the overlapping portion. Accordingly, it is possible to reduce the total processing time compared with the related method.

Moreover, it is another advanced feature related to second embodiment, a subcircuit is generated by collecting cones for which the degree of overlap between all subcircuits assigned to a plurality of test pattern generating means exceeds a certain threshold. Here, if mutually overlapping subcircuits are simultaneously assigned to different test pattern generating means, test patterns for the faults contained in the overlapping portion will be multiply generated by these test pattern generating means. In such a case, the overlap between a subcircuit on its way to generation and an already processed subcircuit is made to be as small as possible. Accordingly, it is possible to reduce the number of test patterns multiply generated by the plurality of test pattern generating means, which can make the test pattern generation processing using distributed processing technique more efficient.

It is further advanced feature related to the third embodiment, the test pattern is generated by handing over an undetected fault list for a subcircuit prepared based on the undetected fault list for the entire circuit, formed so as not to include the undetected fault lists for all subcircuits assigned to a plurality of test pattern generating means in the undetected fault list for the entire circuit, to a test pattern generating means. With this arrangement, it is not needs to give a fault which is now being processed by some test pattern generating means, to a test pattern generating means to which the fault is going to be assigned. Accordingly, it is possible to avoid such a situation in which the same fault is processed simultaneously by a plurality of test pattern generating means, which enhances the efficiency of test pattern generation by means of distributed processing.

While preferred embodiments of the present invention have been described, it is to be understood that the invention is to be defined by the appended claims when read in light of the specification and when accorded their full range of equivalent.

What is claimed is:

1. A method of generating test pattern for a logic circuit comprising the steps of:
   (a) preparing undetected fault list of said logic circuit;
   (b) extracting a plurality of circuit blocks from said logic circuits, each of said circuit blocks provided with corresponding one of output terminals and comprising logic gates and input terminals propagating logic signal to said corresponding one of output terminals, each of said output terminals being an external output terminal of said logic circuit or a scan flip-flop replaced with said external output terminal, and each of said input terminals being an external input terminal of said logic circuits or a scan flip-flop replaced with said external input terminal;
   (c) selecting said plurality of circuit blocks and constructing a subcircuit by selected circuit blocks so as to accelerate test pattern generation of said logic circuit;
   (d) preparing undetected faults list contained in said subcircuit;
   (e) generating a test pattern for said subcircuit;
   (f) renewing said fault list of said logic circuit based on a result of step (e);
   (g) repeating step (c) to (f) till target detection rate of said logic circuit being attained, or test pattern generation of every circuit blocks being completed; and
   (h) merging test patterns of each subcircuits and constructing a test pattern for said logic circuit.

2. The method of claim 1, wherein step (c) comprises;
   selecting said plurality of circuit blocks in ascending order of estimated processing time of test pattern generation thereof and composing a subcircuit by selected circuit blocks.

3. The method of claim 1, wherein the method is executed by distributed processing comprising a local cpu and at least a remote cpu,
   wherein step (e) is executed by said remote cpu, and at least step (c) and (f) are executed by said local cpu.

4. The method of claim 3, wherein step (c) comprises;
   selecting specific circuit blocks and composing a subcircuit by selected circuit blocks, each of said specific circuit blocks having lesser overlapping part with any circuit blocks of now under processing by other remote cpu than a threshold.

5. The method of claim 4, wherein said threshold is increased when specific circuit block satisfying said threshold is exhausted.

6. The method of claim 1, wherein step (d) comprises;
   preparing undetected faults list contained in said subcircuit and deleting said undetected faults contained in said subcircuit from said undetected faults list of said logic circuit; and
   wherein step (f) comprises;
   adding undetected faults in said subcircuit by step (e) to said undetected faults list of said logic circuit.

7. The method of claim 4, wherein step (d) comprises;

preparing undetected faults list contained in said subcircuit and deleting said undetected faults contained in said subcircuit from said undetected faults list of said logic circuit; and wherein step (f) comprises;
adding undetected faults in said subcircut by step (e) to said undetected faults list of said logic circuit.

8. The method of claim 3, wherein step (c) comprising;
selecting specific circuit blocks in ascending order of estimated processing time of test pattern generation thereof and composing a subcircuit by selected specific circuit blocks, each of said specific circuit blocks having lesser overlapping part with any circuit blocks of now under processing by other remote cpu than a threshold.

9. The method of claim 8, wherein step (d) comprising;
preparing undetected faults list contained in said subcircuit and deleting said undetected faults contained in said subcircuit from said undetected faults list of said logic circuit; and wherein step (f) comprising;
adding undetected faults in said subcircuit by step (e) to said undetected faults list of said logic circuit.

10. A system for generating logic circuit test pattern comprising:
means for preparing undetected fault list of said logic circuit;

means for extracting a plurality of circuit blocks from said logic circuits, each of said circuit blocks provided with corresponding one of output terminals and comprising logic gates and input terminals propagating logic signal to said corresponding one of output terminals, each of said output terminals being an external output terminal of said logic circuit or a scan flip-flop replaced with said external output terminal, and each of said input terminals being an external input terminal of said logic circuits or a scan flip-flop replaced with said external input terminal;

means for selecting said plurality of circuit blocks and constructing a subcircuit by selected circuit blocks so as to accelerate test pattern generation of said logic circuit;

means for preparing undetected faults list contained in said subcircuit;

means for generating a test pattern for said subcircuit;

means for renewing said fault list of said logic circuit based on a result of said generating a test pattern for said subcircuit; and means for merging test patterns of each subcircuits and constructing a test pattern for said logic circuit.

11. The test pattern generation system of claim 10, wherein means for selecting said plurality of circuit blocks and constructing a subcircuit by selected circuit blocks selects said plurality of circuit blocks in ascending order of estimated processing time of test pattern generation thereof.

12. A computer readable medium having a test pattern generation program recorded thereon for performing the following steps when such program is executed on a test pattern generation system:

(a) preparing undetected fault list of said logic circuit;

(b) extracting a plurality of circuit blocks from said logic circuits, each of said circuit blocks provided with corresponding one of output terminals and comprising logic gates and input terminals propagating logic signal to said corresponding one of output terminals, each of said output terminals being an external output terminal of said logic circuit or a scan flip-flop replaced with said external output terminal, and each of said input terminals being an external input terminal of said logic circuits or a scan flip-flop replaced with said external input terminal;

(c) selecting said plurality of circuit blocks and constructing a subcircuit by selected circuit blocks so as to accelerate test pattern generation of said logic circuit;

(d) preparing undetected faults list contained in said subcircuit;

(e) generating a test pattern for said subcircuit;

(f) renewing said fault list of said logic circuit based on a result of step (e);

(g) repeating step (c) to (f) till target detection rate of said logic circuit being attained, or test pattern generation of every circuit blocks being completed; and (h) merging test patterns of each subcircuits and constructing a test pattern for said logic circuit.

* * * * *